(12) United States Patent
Kobayashi et al.

(10) Patent No.: US 6,820,179 B2
(45) Date of Patent: Nov. 16, 2004

(54) SEMICONDUCTOR DEVICE AND DATA PROCESSING SYSTEM

(75) Inventors: Nobuharu Kobayashi, Sapporo (JP); Masanobu Kawamura, Tachikawa (JP); Toru Ishida, Tama (JP); Masato Momii, Chitose (JP); Naoki Fujita, Chitose (JP)

(73) Assignees: Hitachi Hokkai Semiconductor, Ltd., Hokkaido (JP); Renesas Technology Corporation, Tokyo (JP)

( * ) Notice: Subject to any disclaimer, the term of this patent is extended or adjusted under 35 U.S.C. 154(b) by 266 days.

(21) Appl. No.: 10/000,034

(22) Filed: Dec. 4, 2001

(65) Prior Publication Data
US 2002/0067638 A1 Jun. 6, 2002

(30) Foreign Application Priority Data
Dec. 4, 2000 (JP) .................................. 2000-367874

(51) Int. Cl.$^7$ ............................................. G06F 12/00
(52) U.S. Cl. ...................... 711/156; 711/102; 711/103; 711/112; 711/114
(58) Field of Search ............................. 711/156, 102, 711/103; 365/208

(56) References Cited

U.S. PATENT DOCUMENTS 5,289,113 A * 2/1994 Meaney et al. ............ 324/73.1
5,293,424 A * 3/1994 Holtey et al. ................ 713/193
5,345,424 A * 9/1994 Landgraf ...................... 365/227
6,184,724 B1 * 2/2001 Lin .............................. 327/80
6,255,729 B1 * 7/2001 Oikawa ........................ 257/723
6,492,719 B2 * 12/2002 Miyamoto et al. .......... 257/686

FOREIGN PATENT DOCUMENTS

JP            2-5455          6/1988
JP          5-343609      6/1992

* cited by examiner

*Primary Examiner*—Donald Sparks
*Assistant Examiner*—Ngoc V Dinh
(74) *Attorney, Agent, or Firm*—Reed Smith LLP; Stanley P. Fisher, Esq.; Juan Carlos A. Marquez, Esq.

(57) ABSTRACT

A semiconductor device which has an internal circuit for performing a circuit operation corresponding to a signal inputted or outputted through an input/output interface circuit adapted to a serial bus. The semiconductor device has a non-volatile storage circuit for storing identification data. Internal identification data stored in the non-volatile storage circuit is compared with external identification data included in an input signal supplied through the serial bus by a comparator circuit. A control circuit is responsive to a match detecting signal generated by the comparator circuit to perform a circuit operation corresponding to an input signal subsequently supplied through the serial bus to change the internal identification data stored in the non-volatile storage circuit.

14 Claims, 19 Drawing Sheets

FIG. 7
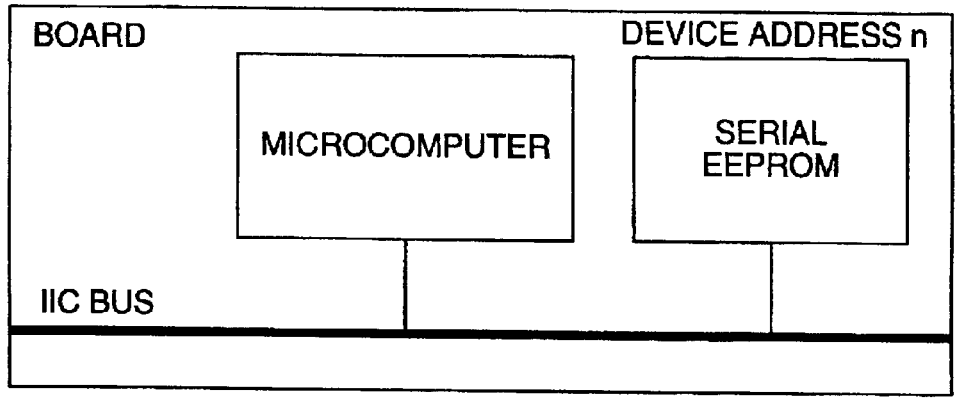
*EEPROM-EQUIPPED MICROCOMPUTER SYSTEM
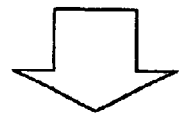
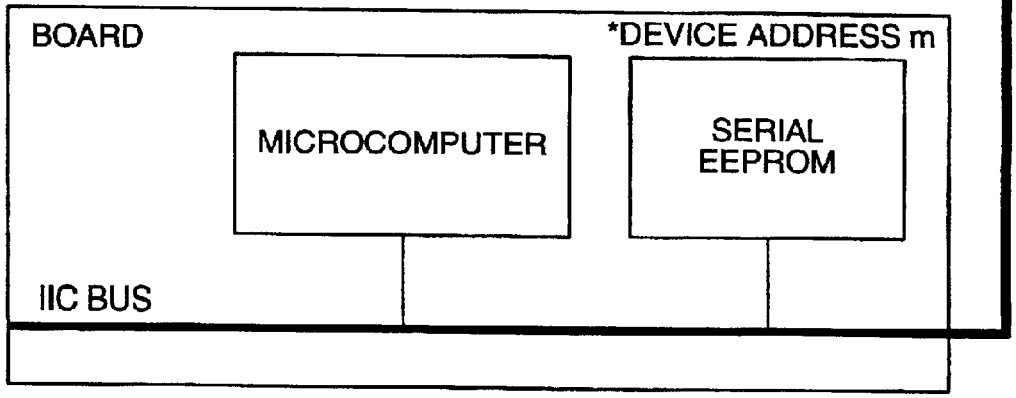
EEPROM-EQUIPPED MICROCOMPUTER SYSTEM (2 CPUS)
OPERABLE AS SERIAL EEPROMS HAVING ADDRESSES n,m

SERIAL EEPROM

| IIC BUS DATA x. | DEVICE ADDRESS WORD* | UPPER MEMORY ADDRESS | LOWER MEMORY ADDRESS | WRITE DATA |
|---|---|---|---|---|
| 1 | 10100000 | H' FF | H' 10 | KEY CODE |
| 2 | 10100000 | H' FF | H' 09 | xxxxx101 |
| 3 | 10101010 | H' 00 | H' 00 | WRITE DATA |

FIG. 13
MONOS MEMORY CELL
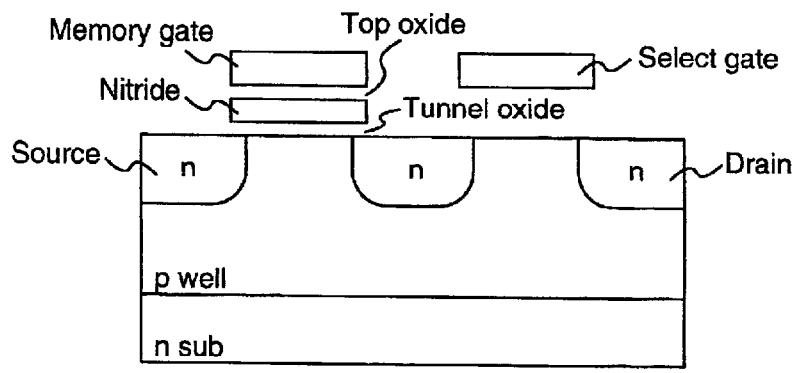
FLOTOX MEMORY CELL
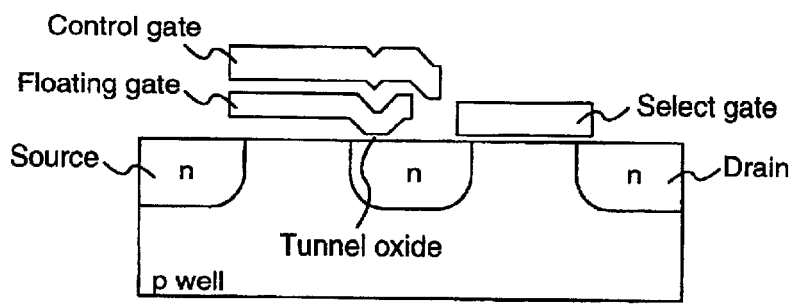
iFLASH MEMORY CELL
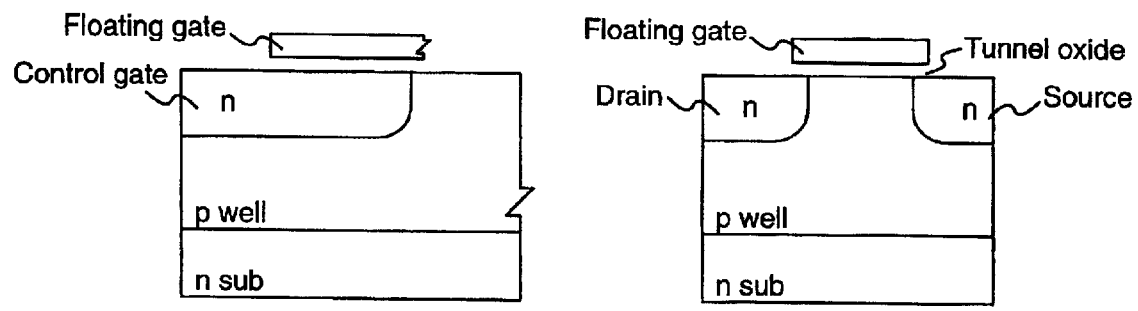

SEMICONDUCTOR DEVICE AND DATA PROCESSING SYSTEM

BACKGROUND OF THE INVENTION

The present invention relates generally to a semiconductor device and a data processing system, and more particularly to technologies which are effectively applied to a semiconductor device fabricated by laminating, for example, two semiconductor chips and encapsulating them with a single resin encapsulant, and to settings of identification data in a data processing system using the semiconductor device.

As one type of semiconductor device, a semiconductor device called MCP (Multi Chip Package) is known. MCP semiconductor devices having a variety of structures have been developed and manufactured, where the most pervasive one is an MCP semiconductor device which comprises two semiconductor chips that are laminated and incorporated in a single package. For example, JP-A-2-5455 (known reference 1) discloses an MCP semiconductor device which comprises a microcomputer chip having a built-in processor unit operated in accordance with a program, and an EEPROM (Electrically Erasable Programmable Read Only Memory) chip having a built-in non-volatile storage unit as a memory chip laminated on the microcomputer chip. The two chips are encapsulated by a single resin encapsulant to complete the MCP semiconductor device.

JP-A-5-343609 discloses an MCP semiconductor device which comprises a CMOS (Complementary MOS) chip having built-in circuits mainly composed of MOSFETs (Metal Oxide Semiconductor Field Effect Transistor), and a bipolar chip having built-in circuits mainly composed of bipolar transistors. The two chips are encapsulated by a single resin encapsulant to complete the MCP semiconductor device.

SUMMARY OF THE INVENTION

It is an object of the present invention to provide a semiconductor device and a data processing system which offer a high level of usability.

It is an another object of the present invention to provide a semiconductor device and a data processing system in which a device address can be set with flexibility while ensuring a high reliability.

The above and other objects and novel features of the present invention will become apparent from the description of this specification and the accompanying drawings.

There has been an increasingly high demand for a semiconductor device which has a microcomputer chip and an EEPROM chip incorporated in a single package. The present inventors found the following challenges prior to the development of a semiconductor device which is fabricated by laminating an EEPROM chip on a microcomputer chip, and encapsulating the two chips with a single resin encapsulant.

In a microcomputer system, device identification data (device address) is set for each peripheral circuit such as a memory circuit. In the most convenient way, the device address may be set, for example, by connecting an external terminal (address pin) to a power supply voltage VCC or a ground potential VSS of the circuits on a circuit board, on which the circuits are mounted, to set a binary signal which may take a high level and a low level. However, in the MCP semiconductor device, since the address pin is connected to VCC or VSS at the time the chips are encapsulated by a single resin encapsulant, the identification data is fixed. The identification data thus fixed would cause difficulties and inconvenience in manufacturing and handling the MCP semiconductor device, e.g., manufacturing a plurality of different types of semiconductor devices by setting a plurality of different identification data in semiconductor devices having the same functions such that the semiconductor devices can be adapted to a variety of data processing systems, managing the custody of the semiconductor devices by the identification data, and mounting a semiconductor device having a correct device address in an assembling process.

The following outlines a representative aspect of the invention disclosed in the present application. A semiconductor device includes an internal circuit for performing a circuit operation corresponding to a signal inputted or outputted through an input/output interface circuit adapted to a serial bus, a non-volatile storage circuit for storing identification data, a comparator circuit for comparing internal identification data stored in the non-volatile storage circuit with external identification data included in an input signal supplied through the serial bus, and a control circuit responsive to a match detecting signal from the comparator circuit to perform a circuit operation corresponding to an input signal subsequently supplied through the serial bus to change the internal identification data in the non-volatile storage circuit.

The following outlines another representative aspect of the invention disclosed in the present application. A semiconductor device includes an internal circuit for performing a circuit operation corresponding to a signal inputted or outputted through an input/output interface circuit adapted to a serial bus, and a non-volatile storage circuit for storing identification data, wherein the internal circuit is permitted to perform an operation for changing the identification data by an input signal supplied through the serial bus when the internal state of the internal circuit transitions to a first state.

The following outlines a further representative aspect of the invention disclosed in the present application. A data processing system includes a plurality of semiconductor devices each having an internal circuit for performing a circuit operation corresponding to a signal inputted or outputted through an input/output interface circuit adapted to the serial bus, and a non-volatile storage circuit for storing identification data, wherein in each of the semiconductor devices, the identification data of each semiconductor device can be changed by an input signal supplied through the serial bus when the internal state of the internal circuit transitions to a first state.

The following outlines a further representative aspect of the invention disclosed in the present application. A semiconductor device includes an internal circuit for performing a circuit operation corresponding to a signal inputted or outputted through an input/output interface circuit adapted to a serial bus, a non-volatile storage circuit for storing identification data, a comparator circuit for comparing internal identification data stored in the non-volatile storage circuit with external identification data included in an input signal supplied through the serial bus, and a control circuit responsive to a match detecting signal from the comparator circuit to perform a circuit operation corresponding to an input signal subsequently supplied through the serial bus to change the internal identification data in the non-volatile storage circuit. Thus, the semiconductor device provides high usability and flexibility in setting a device address.

A semiconductor device includes an internal circuit for performing a circuit operation corresponding to a signal inputted or outputted through an input/output interface circuit adapted to a serial bus, and a non-volatile storage circuit for storing identification data, wherein the internal circuit is permitted to perform an operation for changing the identification data by an input signal supplied through the serial bus when the internal state of the internal circuit transitions to a first state. Thus, the semiconductor device provides high usability and flexibility in setting a device address.

A data processing system includes a plurality of semiconductor devices each having an internal circuit for performing a circuit operation corresponding to a signal inputted or outputted through an input/output interface circuit adapted to the serial bus, and a non-volatile storage circuit for storing identification data, wherein in each of the semiconductor devices, the identification data of each semiconductor device can be changed by an input signal supplied through the serial bus when the internal state of the internal circuit transitions to a first state to set a device address in the non-volatile storage circuit. Consequently, the data processing system provides effective utilization of a mounting space on a board which underlies the system, or a reduction in size of the board, as well as flexible adaptability in modification, expansion and the like of the system.

BRIEF DESCRIPTION OF THE DRAWINGS

FIG. 7 is a diagram illustrating the configuration of another embodiment of the data processing system according to the present invention;

FIG. 13 is a cross-sectional view generally illustrating an embodiment of a non-volatile memory device used in the present invention;

DESCRIPTION OF THE EMBODIMENTS

Figure 1:
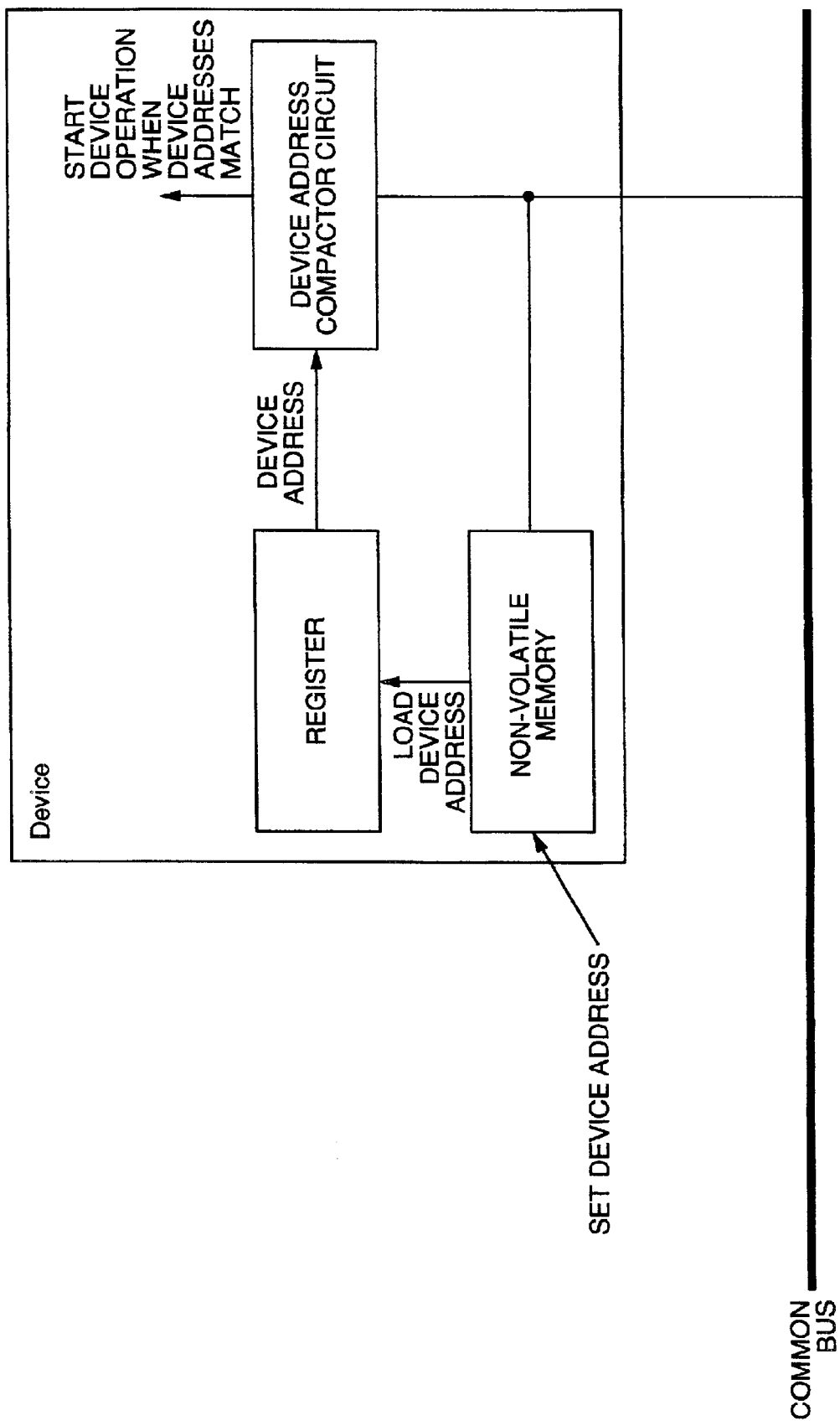
FIG. 1 is a block diagram generally illustrating an embodiment of a semiconductor device according to the present invention.

FIG. 1 is a block diagram generally illustrating an embodiment of a semiconductor device according to the present invention. The device of this embodiment is mounted in a system which has a common bus. Stated another way, the semiconductor device is designed to have an input/output interface circuit which is adapted to the common bus. This embodiment employs a strategy of storing a device address assigned to the semiconductor device in a non-volatile memory contained therein, so that the device address of the semiconductor device can be set through software. Though not particularly limited, the common bus is assumed herein to be a serial bus such as IIC bus, where the IIC ($I^2C$) is a trademark of Philips.

The device address stored in the non-volatile memory is transferred to a register. A device address comparator circuit compares the device address held in the register with a device address inputted through the common bus to form a control signal for instructing the semiconductor device to start operating when a match is found between the two device addresses.

Though not particularly limited, the nonvolatile memory may be an electrically writable and erasable non-volatile memory, the contents of which can be rewritten. With this rewriting operation, the device address can be set again even after the semiconductor device is mounted on a printed board which forms part of a system.

Figure 2:
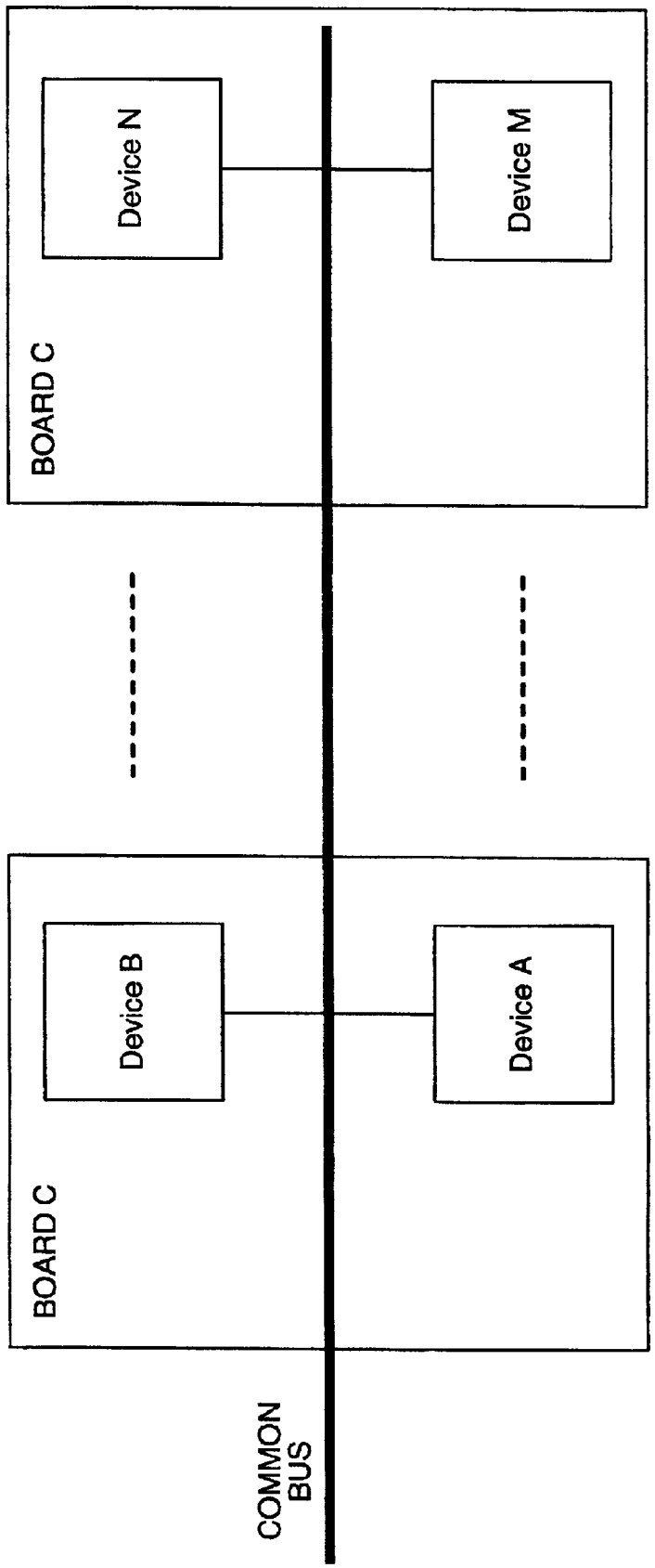
FIG. 2 is a block diagram generally illustrating an embodiment of a data processing system using semiconductor devices according to the present invention.

FIG. 2 is a block diagram generally illustrating an embodiment of a data processing system which uses semiconductor devices according to the present invention. As illustratively shown, in this embodiment, the data processing system is composed of at least two boards C, each of which have two semiconductor devices (Device A, Device B) or (Device M, Device N) mounted thereon. When a plurality of semiconductor devices (Devices A through N) are mounted on a single data processing system in this manner, the respective semiconductor devices must be assigned different device addresses from one another.

In this embodiment, each of the semiconductor devices contains a non-volatile memory, as illustrated in the embodiment of FIG. 1, in which the device address is set through software in accordance with an approach, later described, while the respective semiconductor devices are mounted in the system. This strategy can reduce the number of external terminals of each semiconductor device assigned for the device address, as well as facilitate the manufacturing, custody management, shipment and system assembly because of completely eliminated requirements for consideration on the device addresses corresponding to the respective semiconductor devices mounted in a particular system upon manufacturing, custody management, shipment and assembly of the semiconductor devices.

With the foregoing configuration which enables the device address to be set through software, boards which form part of a data processing system can be standardized as the boards C. Specifically, as compared with a semiconductor device provided with a device address setting pin that is connected to a power supply voltage VCC or to a ground line VSS of a circuit on a board, on which the semiconductor device is mounted, a plurality of circuit boards having different wiring patterns need not be formed corresponding to individual device addresses. The standardized circuit boards C can eliminate such a wiring pattern, thereby resulting in effective utilization or reduction in size of the board space.

Figure 3:
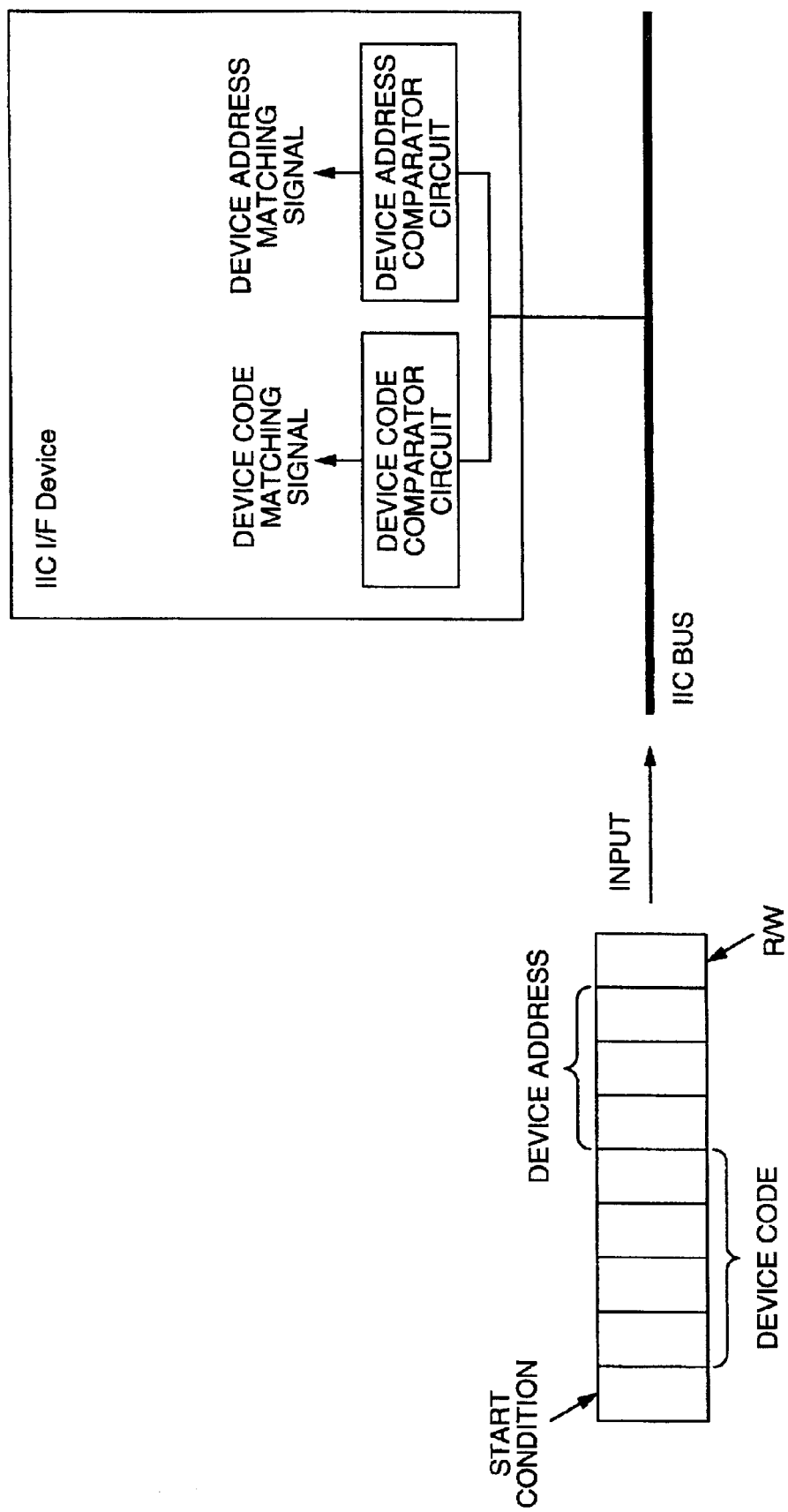
FIG. 3 is a block diagram illustrating the configuration of an embodiment of an IIC bus interface used in the semiconductor device according to the present invention.

FIG. 3 illustrates the configuration of an embodiment of the IIC bus interface which may be used in the semiconductor device according to the present invention. Though not particularly limited, this embodiment is intended for use with an IIC bus interface EEPROM (Electrically Erasable and Programmable Read Only Memory, hereinafter called the "serial EEPROM").

In the IIC bus interface, the first byte of a communication subsequent to a start condition consists of four bits allocated to a device code; three bits to a device address; and one bit to a R/W bit indicative of read or write. The device code is fixed by the type of particular semiconductor device, and assigned a 4-bit number such as "1010" for an EEPROM as in this embodiment. Different device codes from the above are assigned to other devices such as an A/D converter, an LED driver, and the like, respectively.

Within an input signal supplied through the IIC bus interface, the four bits corresponding to the device code is inputted to a device code comparator circuit which compares the inputted device code with the fixed device code assigned to the semiconductor device. The fixed device code is fixedly set in the semiconductor device by wiring or the like when it was manufactured. The device code comparator circuit compares the fixedly set device code with the inputted device code, and forms a device code matching signal when a match is found between the two device codes.

Within the input signal supplied through the IIC bus interface, the three bits corresponding to the device address is inputted to a device address comparator circuit which compares the inputted device address with a device address set in the non-volatile memory. The device address in the non-volatile memory has been set at an arbitrary address by a writing operation or a rewriting operation, later described. The device address comparator circuit compares the device address set in the non-volatile memory with the inputted device address to form a device address matching signal when a match is found between the two device addresses.

The semiconductor device adapted to the IIC bus interface (IIC I/F Device) in this embodiment starts a read or a write operation in response to the signal R/W when the device code matching signal and device address match signal are both formed. The read or write operation, details of which will be later described, may be outlined as follows. An internal address is specified by an address signal included in an input signal which is inputted subsequent to the input signal including the device code, device address and R/W, and the semiconductor device fetches and writes write data included in a subsequently incoming input signal when a write operation is instructed, and outputs read data to the IIC bus when a read operation is instructed.

Figure 4:
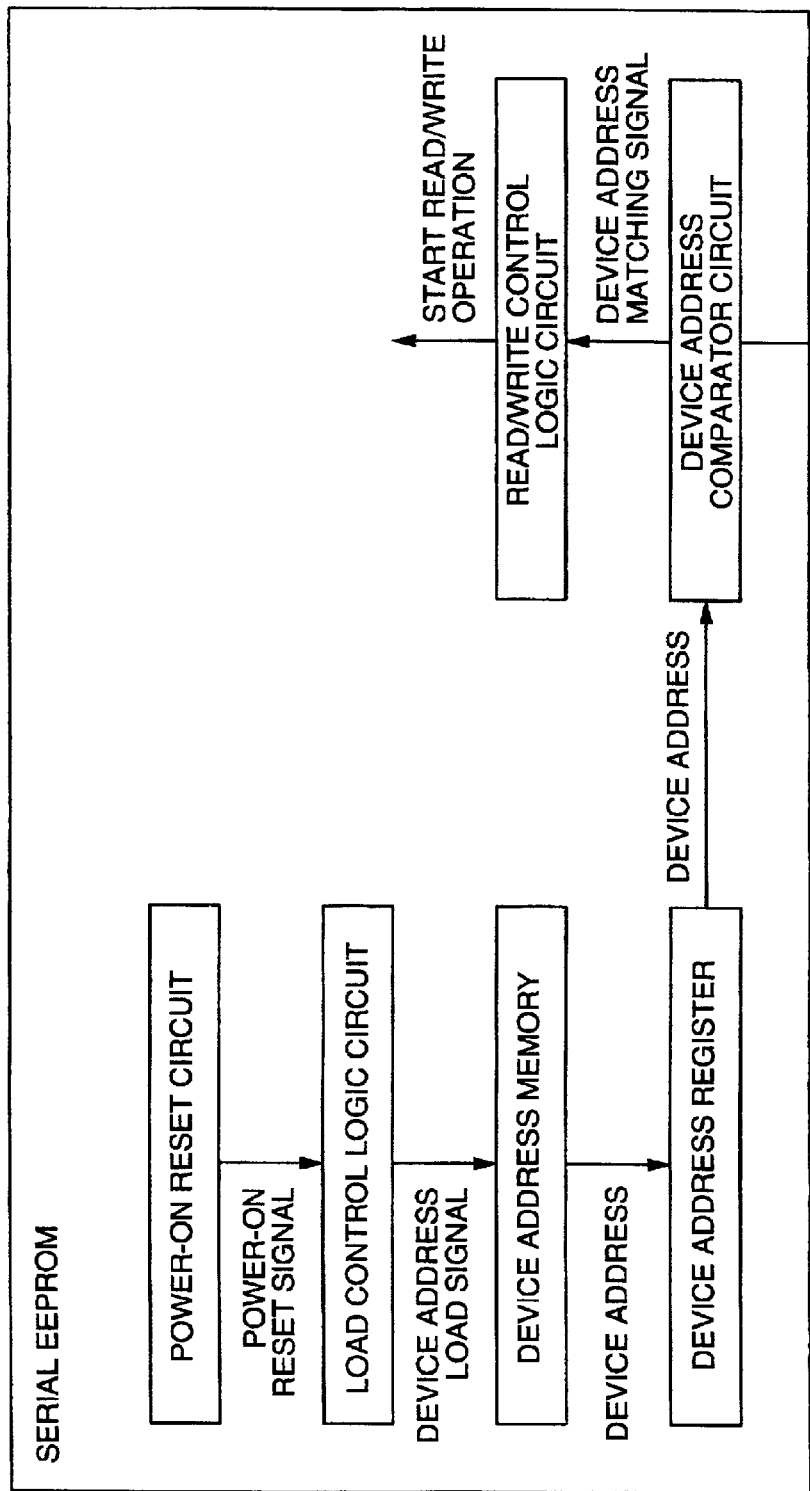
FIG. 4 is a block diagram illustrating the configuration of a serial EEPROM according to the present invention for explaining the operation of the serial EEPROM.

FIG. 4 illustrates the configuration of the serial EEPROM according to the present invention for explaining an exemplary operation of the serial EEPROM. In the serial EEPROM of the illustrated embodiment, a device address is set in a built-in device address memory (non-volatile memory). A power-on reset circuit generates a power-on reset signal when a power supply voltage VCC reaches a predetermined level. This power-on reset signal is sent to a load control logic circuit which supplies the device address memory with a device address load signal in response to the power-on reset signal inputted thereto.

The device address memory, responsive to the device address load signal supplied thereto, reads the stored device address which is transferred to a device address register. Consequently, the device address register holds the device address which is stored in the device address memory.

Thus, when an input signal such as that shown in FIG. 3 is supplied to the serial EEPROM through the IIC bus, the device address comparator circuit compares the device address loaded into the device address register in response to the power-on reset signal with the inputted device address, rather than accessing the device address memory to retrieve the device address stored therein each time the input signal is supplied. The device address matching signal formed in the device address comparator circuit is sent to a Read/Write control circuit which forms a Read/Write operation start signal.

Though omitted in FIG. 4, the EEPROM includes an address input circuit, an address select circuit, a memory array, and the like, all of which is controlled by a control circuit that includes the Read/Write control circuit and the like.

Figure 5:
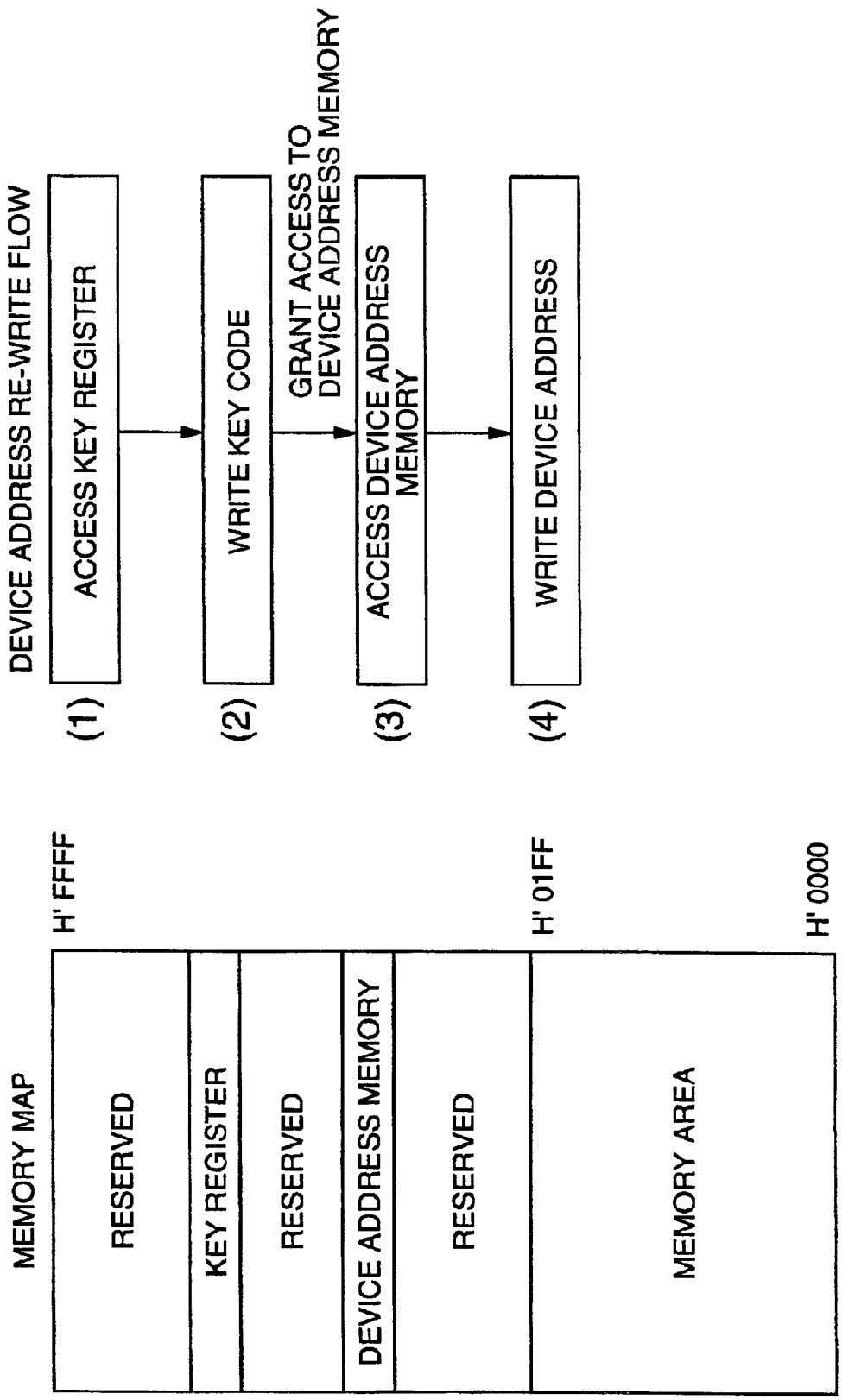
FIG. 5 shows a memory map and a flow diagram for explaining an exemplary address setting operation for the serial EEPROM according to the present invention.

FIG. 5 shows a memory map and a flow diagram for explaining an exemplary address setting operation for the serial EEPROM according to the present invention. In the memory map for the serial EEPROM, addresses from H'0000 to H'FFFF are allocated, wherein an area from H'0000 to H'01FF is used as a memory area of the EEPROM for storing data and programs. In the remaining address space from H'0200 to H'FFFF, a portion is allocated for addresses of a device address memory and a key register, while the remainder is reserved.

On the assumption that the serial EEPROM has the foregoing address space in the memory map, a device address rewriting flow (procedure) is executed in the following manner. At step (1) in FIG. 5, the key register is accessed. In other words, an input signal as shown in FIG. 3 is supplied through the IIC bus. The serial EEPROM is provided with a device code and a device address, and is instructed to perform a write operation. On the promise of this operation, a preliminary device address has been written into a device address memory comprised of the non-volatile memory in the serial EEPROM. This preliminary device address is also used for memory accesses for writing and reading in a probe test, a burn-in test after assembly, and the like of the serial EEPROM. In other words, since the device code and device address are essentially inputted for accessing the serial EEPROM of this embodiment, the preliminary device address must have been stored as well for the operation tests and the like.

An address signal, to which the key register is assigned, is inputted using the preliminary device address, and a predetermined key code is written at step (2). The internal control circuit compares the key code written into the key register with the preset key code, and forms a signal for granting an access to the device address memory when a match is found between the two key codes. An address signal, to which the device address memory is assigned, is written at step (3), and a device address different from the preliminary device address is inputted to re-write the preliminary device address at step (4).

By employing the device address re-writing procedure as described above, a device address to be preserved can be prevented from being erroneously rewritten by data or a portion of a program written into the device address memory as a result of an erroneously specified address, which inadvertently corresponds to the device address memory, during a normal write operation to the serial EEPROM. In other words, since an access to the key address register and the matching of the key codes must be accomplished before writing data which is to be re-written with the address of the device address memory, an access to the device address memory is not granted only by erroneously specifying its address in a normal write operation of the serial EEPROM. In this manner, the device address can be arbitrarily set or re-written while ensuring a high reliability.

Figure 6:
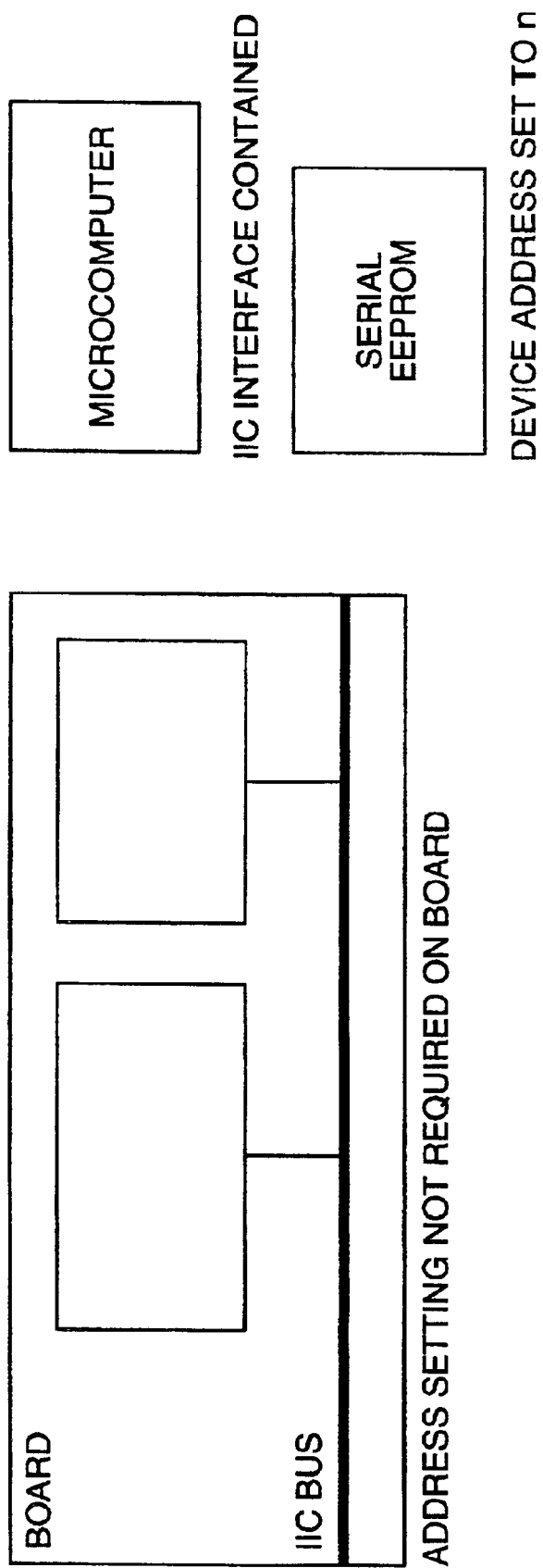
FIG. 6 is a diagram illustrating the configuration of an embodiment of a data processing system according to the present invention.

FIG. 6 illustrates the configuration of an embodiment of a data processing system according to the present invention. The data processing system of this embodiment is composed of two semiconductor devices mounted on a single board which has an IIC bus. The semiconductor devices may be a microcomputer (one-chip microcomputer) which contains an IIC interface, and a serial EEPROM, respectively. The device address of the serial EEPROM is set to a preliminary address n.

When the two semiconductor devices are mounted on the board, the device address n is set in a built-in device address memory of the serial EEPROM, such that the address need not be set on the board. For this reason, the device does not require wires and the like for setting the device address corresponding to a particular semiconductor device mounted thereon, so that the board can be standardized (made common) under the condition that the board is mounted with semiconductor devices to which the present invention is applied. In addition, the region on the board, from which the wires and the like can be removed, may be allocated for mounting other electronic parts, or cut away to reduce the size of the board. When a data processing system is configured only of two components, i.e., a microcomputer and a serial EEPROM as in this embodiment, the preliminary device address n set for the serial EEPROM can be used as it is.

FIG. 7 illustrates another embodiment of the data processing system according to the present invention. The data processing system of this embodiment is composed of a combination of two boards each having an IIC bus, as illustrated in the embodiment of FIG. 6. Specifically, two boards, each of which has a microcomputer and a serial EEPROm mounted thereon, are interconnected through their respective IIC buses to configure a multi-CPU based data processing system. In such a data processing system, a device address in the serial EEPROM mounted on one board is maintained to be n, while a device address in the serial EEPROM mounted on the other board is re-written from a preliminary address n to m. Since the device address can be changed on-board for the serial EEPROM in this manner, the change of the device address can be applied when the system is extended.

Figure 8:
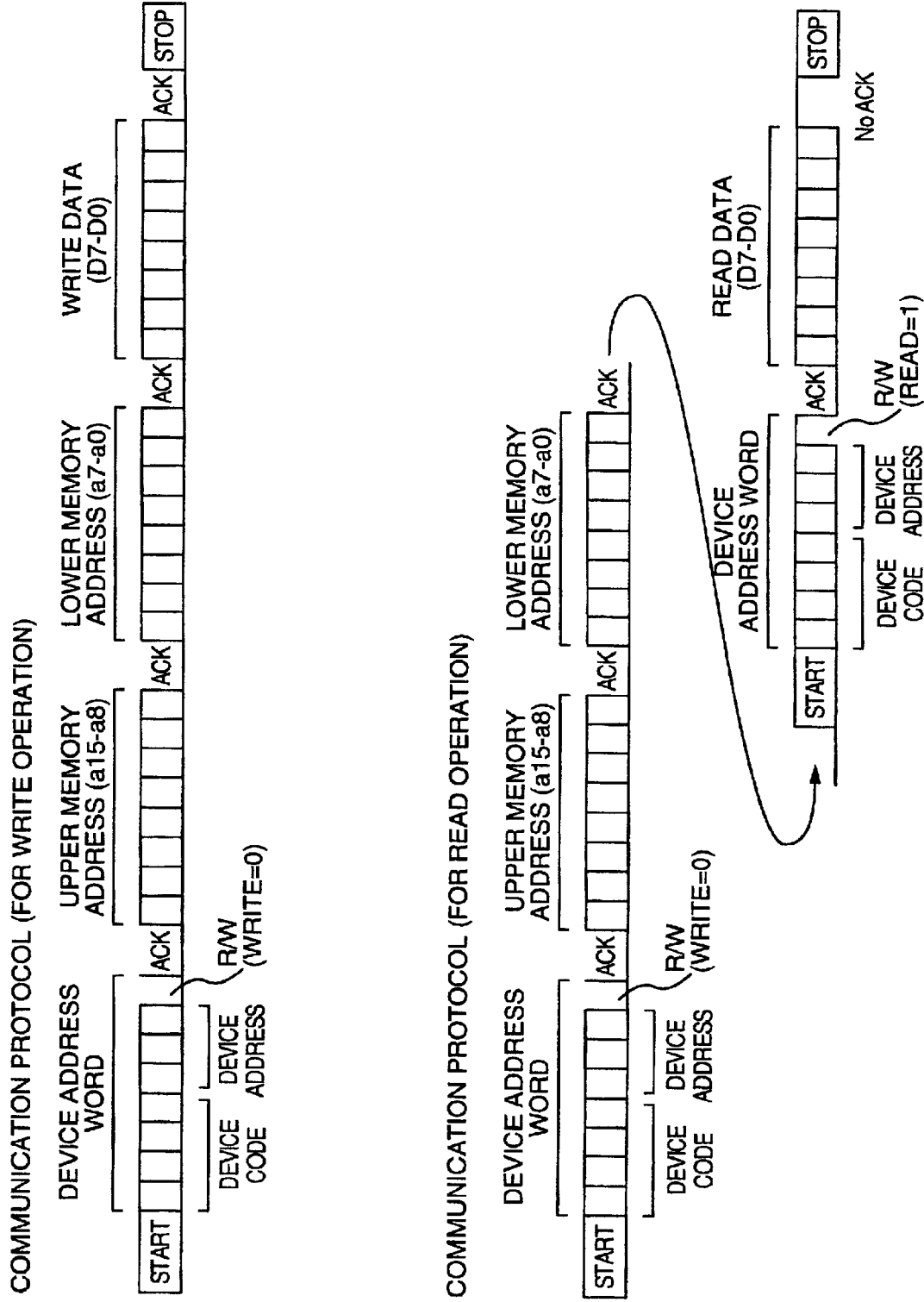
FIG. 8 is a timing diagram for explaining a communication protocol in an IIC bus interface.

FIG. 8 shows a timing diagram for explaining a communication protocol for use with the IIC bus interface. FIG. 8, which shows a write operation and a read operation, is provided for explaining the operation viewed from the master side (for example, on the microcomputer side).

The IIC bus interface employs a pair of signal lines for a serial clock (SCL) and a serial input/output (SDA). The serial clock (SCL) is a clock for setting a timing for inputting/outputting serial data. Specifically, data is fetched at a rising edge of the clock, and data is outputted at a falling edge of the clock. It should be noted that the serial clock (SCL) is omitted in FIG. 8.

A pull-up resistor is connected to a serial input/output terminal on the semiconductor device because an output circuit is in an open-drain configuration. Though not particularly limited, the serial EEPROM may be provided with a write protect terminal, such that the write protect terminal, when set to high level, prohibits re-writing of the entire memory array. Therefore, the write protect terminal is set to low level for re-writing the memory array. The write protect terminal is not connected to the serial bus but connected to a dedicated signal line. A read operation can be performed for the entire memory array irrespective of the level of the write protect terminal.

The communication protocol (for a write operation) is explained below. A start condition START is set by changing serial data (SDA) from high level to low level when the serial clock (SCL) is at high level. After setting START, an 8-bit device address word is routed in synchronism with the serial clock (SCL). The device address word consists of a 4-bit device code, a 3-bit device address, and a 1-bit R/W signal. The R/W signal is set to "O" for a write operation (R/W=0).

In the IIC bus interface, address data as well as read and write data are transmitted/received in units of eight bits, just like the device address word. An acknowledge signal ACK is a signal indicating that the 8-bit data has been normally received. The reception side outputs a logical "0" (low level) at the ninth serial clock (SCL). Specifically, as the 8-bit device address word is transmitted from the master side, the serial EEPROM, on the slave side, transfers the ACK signal set at "0" (ACK=0) at the ninth clock, which is then received on the master side.

Upon receipt of the ACK signal, the master transmits upper eight bits of a memory address (a15–a8). Then, upon receipt of the ACK signal corresponding thereto, the master transmits lower eight bits of the memory address (a7–a0). Upon receipt of the ACK signal corresponding to the lower memory address bits (a7–a0), the master subsequently transmits write data (D7–D0). Upon receipt of the ACK signal corresponding to the write data (D7–D0), the master transmits a stop condition STOP. The serial EEPROM on the slave side writes the write data after erasing data at the address specified by the memory address (a15–a0). The stop condition STOP is set by changing the serial data (SDA) from low level to high level when the serial clock (SCL) is at high level.

The write operation into the serial EEPROM can be applied as it is to the aforementioned step (1) where the key register is accessed, and step (2) where a key code is written in the aforementioned FIG. 5. Specifically, a device address indicated by a device address word specifies the preliminary address (address before re-writing), and a memory address specifies the address of the key register (8×2) instead of an address in the memory area. Then, the key code may be inputted as write data. Subsequently, as the address of the device address memory (8×2) is inputted, a device address to be re-written is inputted as write data. Afterward, the master receives the ACK signal from the serial EEPROM and transmits the stop condition STOP. In the serial EEPROM, the new device address is written into the device address memory after it is erased.

In the foregoing state remaining unchanged, although a new device address will be written into the device address memory, the previous device address is still stored in the device address register, so that the new device address written into the device address memory is loaded into the device address register by once powering off and again powering on the serial EEPROM, or by inputting a special signal, as described later.

The communication protocol (for a read operation) is explained below. As is the case with the write operation, a start condition (START) is inputted, and an B-bit device address word is routed in synchronism with the serial clock (SCL). The device address word consists of a 4-bit device code, a 3-bit device address, and a 1-bit R/W signal. In this event, the R/W signal is set to "0" (low level). Upon receipt of the ACK signal corresponding to the device address word, the master transmits upper eight bits of a memory address (a15–a8). Upon receipt of the ACK signal corresponding to the upper half of the memory address, the master transmits lower eight bits of the memory address (a7–a0). Up to this time, a dummy write operation is performed in spite of the read operation. In other words, the dummy write operation is utilized for inputting the address for the read operation.

The serial EEPROM has an internal address counter which increments a lastly accessed address (N) in the preceding read operation or write operation by one and holds the resulting address (N+1). Thus, a read operation can be performed using this address (N+1). For this reason, an address signal need not be inputted each time a read operation is performed. The aforementioned dummy write operation is used for setting a new address irrespective of the preceding access.

The start condition (START) is again inputted, and a device address word is inputted. Specifically, as the device code and device address are inputted and the R/W signal is set to logical "1" in a manner similar to the write operation, read data D7–D0 are outputted from the serial EEPROM after the ACK signal is received. In other words, the read data is outputted from the address (N+1) specified by the dummy write operation. The acknowledge signal set at "1" (ACK=1) and stop condition STOP are inputted in this order (the bus may be opened instead of inputting the ACK signal) after outputting the read data, followed by termination of the read operation with the serial EEPROM.

For setting the system in a mode in which data is continuously read, the master sets the ACK signal to logical "0," causing the serial EEPROM to send data from the address (N+2) which is incremented by one from the preceding address. When the end address in the serial EEPROM is reached, the address rolls over to the zero address, thereby enabling continuous reading of sequential data. For terminating such a continuous data read operation, the ACK signal set at "1" (ACK=1) and stop condition STOP are inputted in this order (the bus may be opened instead of inputting the ACK signal) in the foregoing manner, followed by termination of the reading operation with the serial EEPROM.

Figure 9:
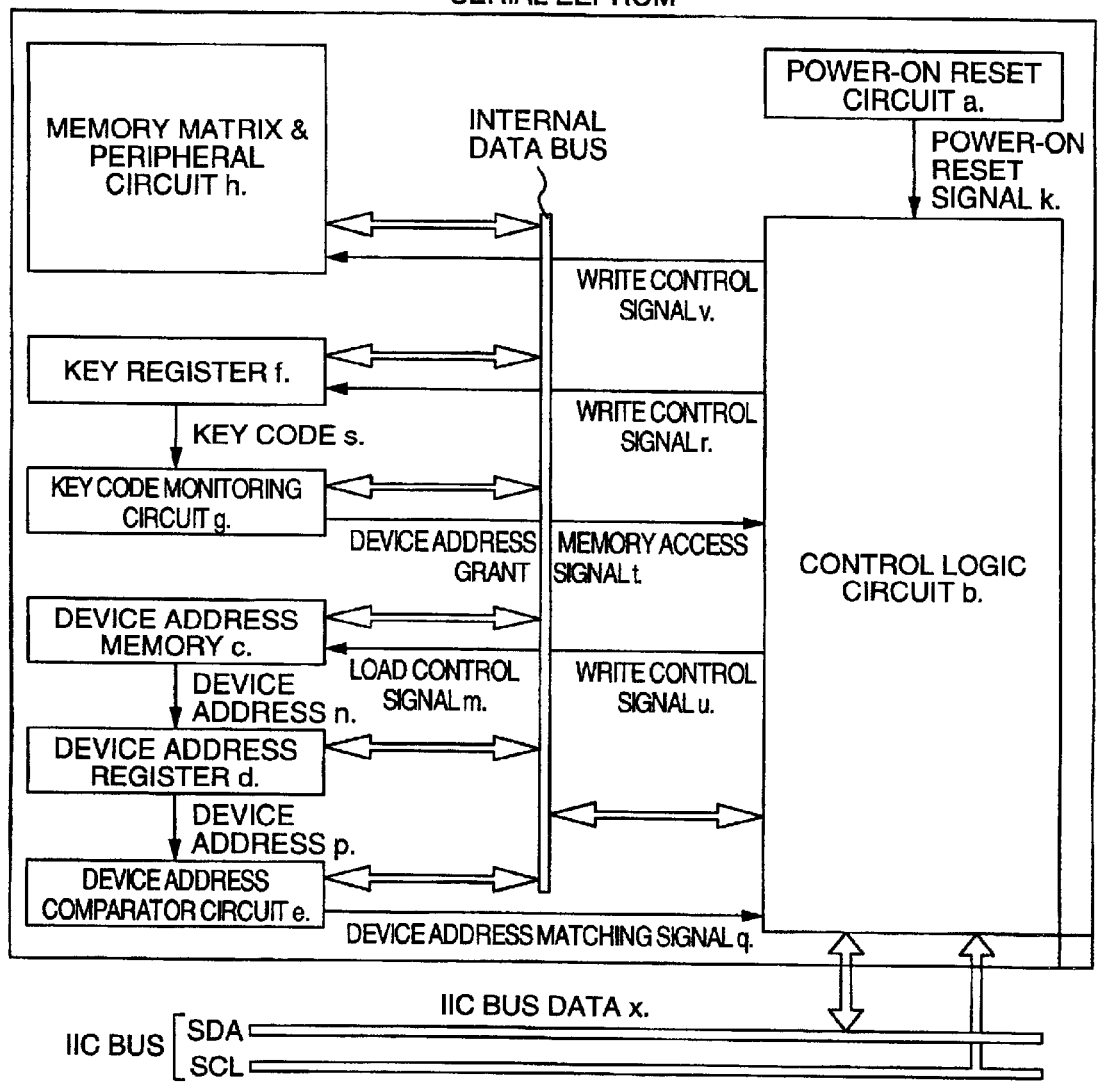
FIG. 9 is a block diagram generally illustrating an embodiment of a serial EEPROM according to the present invention.

FIG. 9 is a block diagram generally illustrating an embodiment of the serial EEPROM according to the present invention. A device address memory c. is implemented by a non-volatile memory as mentioned above, in which "000" has been stored as a preliminary device address during the manufacturing. As the serial EEPROM is powered on, a power-on reset circuit a. is monitoring a power supply voltage VCC, and generates a power-on reset signal k. when the power supply voltage VCC reaches a predetermined level.

A control logic circuit b. generates a load control signal m. in response to the power-on reset signal k. The load control signal m. is inputted to the device address memory c. to instruct a read operation. A device address n. (000) read from the device address memory c. is transferred to a device address register d. Consequently, the device address register d. holds the device address n., and sends the held device address p. to a device address comparator circuit e. With the foregoing operation, the device address is set corresponding to the device address n. stored in the device address memory c. In this state, an access can be granted to the serial EEPROM as illustrated in FIG. 8.

The operation for rewriting the preliminary device address to an arbitrary address is performed in the following manner. In synchronism with the clock signal SCL on the IIC bus, the start condition and serial data x.1 corresponding to a device address word—upper memory address—lower memory address—write data are inputted to the serial EEPROM through the serial data bus SDA, in the manner illustrated in FIG. 8. The device address comparator circuit e. compares the device address (000) included in the device address word with the device address p. (000) held in the device address register d., and sends a device address matching signal q. to the control logic circuit b. It should be noted that the device code assigned to the serial EEPROM is also compared with an inputted device code, and the rewrite operation is performed under the condition that a match is also found between the two device codes.

The control logic circuit b., responsive to the device address matching signal q. (generated when the device codes also match), forms a write control signal r. for instructing a selection of a key register f. from the upper (H'FF) and lower (H'10) halves of the memory address and a write operation, and outputs a key code included in the write data to the internal data bus. In this manner, the key code inputted through the IIC bus is written into the key register f.

The key code s. written into the key register f. is sent to a key code monitoring circuit g. The key code monitoring circuit g. compares a preset key code with the key code s. written into the key register f., and generates a device address memory access grant signal t., when a match is found, and sends the access grant signal t. to the control logic circuit b.

From the IIC bus, in synchronism with the clock signal SCL, the start condition and serial data x.2 corresponding to a device address word—upper memory address—lower memory address—write data are inputted through the serial data bus SDA, in the manner illustrated in FIG. 8.

The control logic circuit b., responsive to the device address matching signal q. (generated when the device codes also match), form a write control signal u. for instructing a selection of the device address memory c. from the upper (H'FF) and lower (H'09) halves of the memory address and a write operation, and outputs a new device address (101) included in the write data to the internal data bus. In this manner, the device address inputted through the IIC bus is written into the device address memory c.

It should be noted that the preliminary device address "000" is erased prior to the writing as described above. However, the erasing operation may be omitted if the device address "101" can be set by overwriting the preliminary address "000" in the nonvolatile memory. In other words, the erasing operation can be eliminated if the device address may be rewritten only once, whereas the erasing operation should be performed before the writing if re-writing of the device address is permitted as many times as required.

In the foregoing state, the new device address "101" has been stored in the device address memory c., while the device address register d. still holds the loaded device address "000." Therefore, even if the re-written address is inputted in this state, the serial EEPROM cannot be accessed. To make the serial EEPROM accessible, it is once powered off and again powered on to load the re-written device address "101" into the device address register d.

When data is subsequently written into the serial EEPROM, the start condition and serial data x.3 corresponding to a device address word—upper memory address— lower memory address—write data are inputted from the IIC bus as the serial data SDA in synchronism with the clock signal SCL in the manner illustrated in FIG. 8.

The control logic circuit b. receives the device address matching signal q. (the device codes also match), selects a memory cell in a memory area indicated in the memory map of FIG. 5 from the upper (H'00) and lower (H'00) memory address to form a write control signal, not shown, and outputs the write data to the internal data bus. Consequently, the data inputted through the IIC bus is written into the memory area. It should be noted that the memory cell at the address H'0000 is erased prior to the writing as described above.

Though not shown, the serial EEPROM may be provided with a reset signal input terminal. Specifically, the device address memory is read by setting the reset signal input terminal to a predetermined level. Also, other registers and the like may be initialized using the reset signal input terminal. When the serial EEPROM is provided with such a reset signal input terminal, the EEPROM need not be powered off and again powered on each time the device address is changed. Therefore, the provision of the reset signal input terminal can eliminate the power-on reset circuit.

Figure 10:
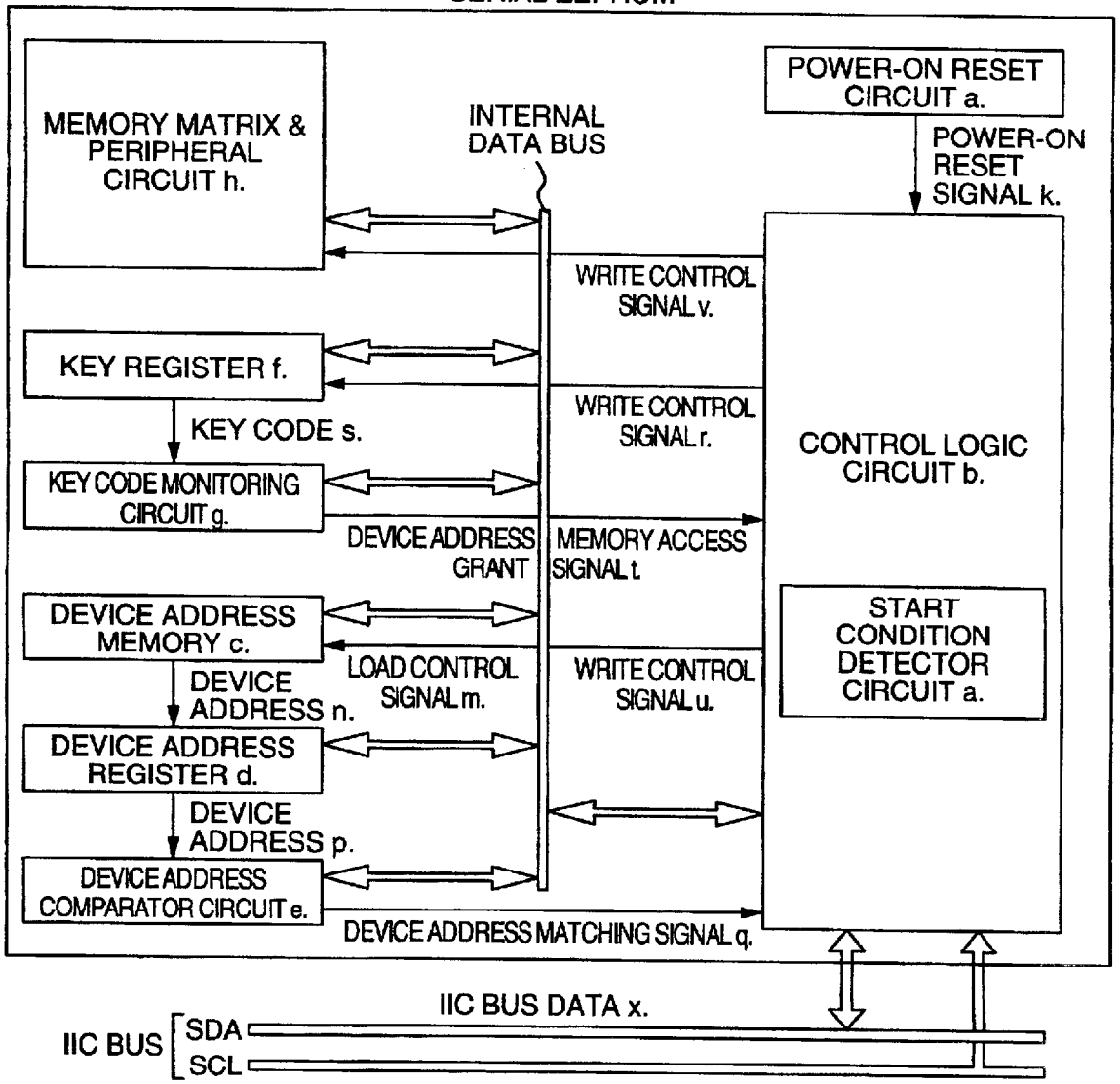
FIG. 10 is a block diagram generally illustrating another embodiment of the serial EEPROM according to the present invention.

FIG. 10 is a block diagram generally illustrating an embodiment of the serial EEPROM according to the present invention. A device address memory c. is implemented by a non-volatile memory as mentioned above. In this embodiment, a start condition detector circuit a. in a control logic circuit b. is utilized. The start condition detector circuit a. in the control logic circuit b. detects a start condition through a serial data bus SDA in synchronism with a clock signal SCL as mentioned above, in the manner illustrated in FIG. 8, receives a subsequently inputted device address word at an input terminal, generates a load control signal m. to instruct the device address memory c. to perform a read operation, and transfers a stored device address n. to a device address register d. In this manner, a device address comparator circuit e. can compare the stored device address n. with a device address which is inputted after the start condition.

In the foregoing configuration, since the device address c. is read each time the start condition is detected, the serial EEPROM need not be once powered off and again powered on each time the device address is changed. In other words, the power-on reset circuit can be eliminated by effectively utilizing the start condition detector circuit a. Furthermore, the start condition detector circuit a. may be combined with a power-on reset circuit and a reset input signal terminal, and have an additional control register, not shown, which is initialized by a reset signal. When one piece of data in the control register is assigned to indicate whether or not the device address has been transferred, the device address need be transferred only once after resetting the serial EEPROM by updating the data in the control register in response to a transfer of the device address.

Figure 11:
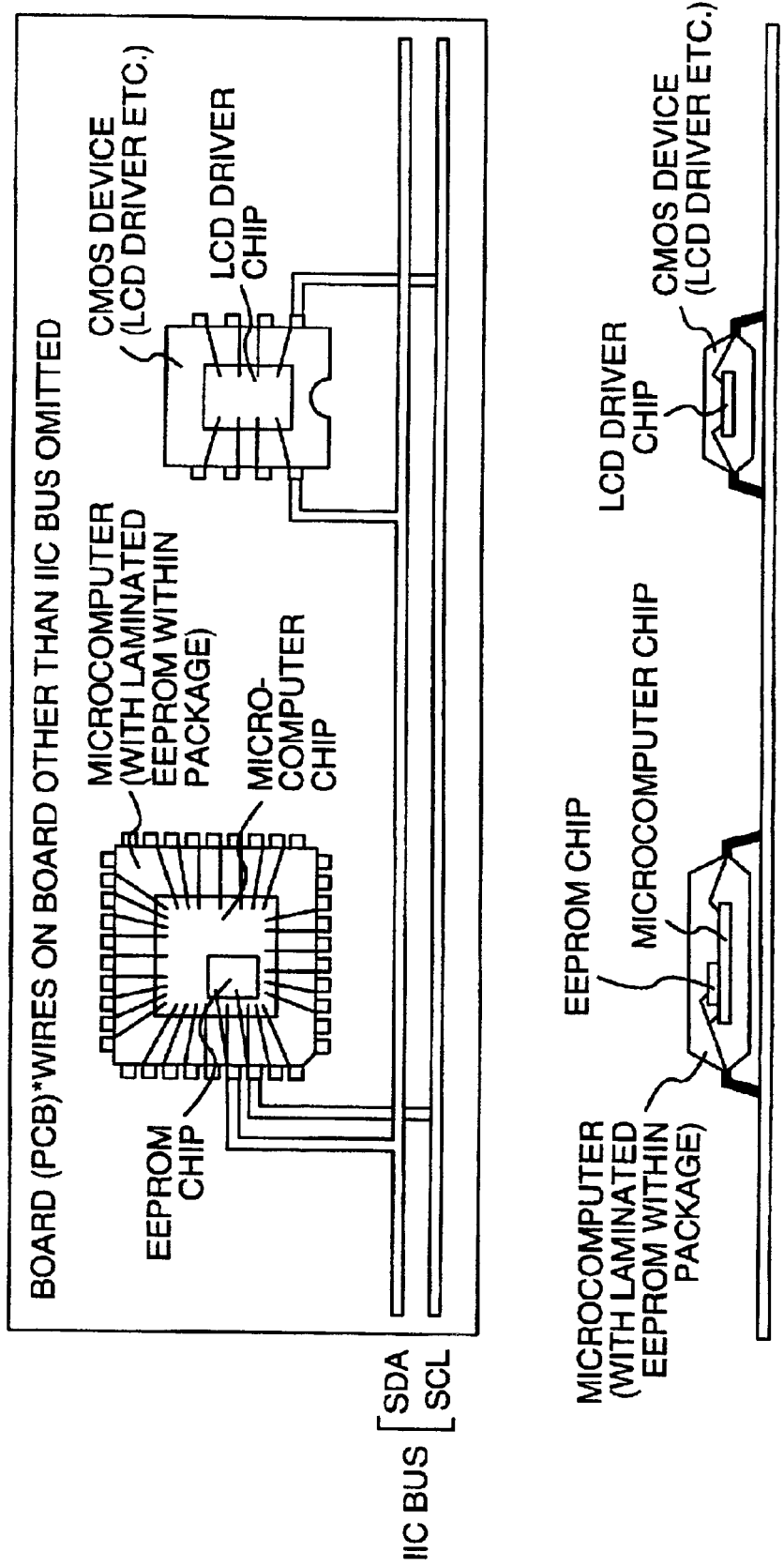
FIG. 11 includes a top plan view and a side view illustrating an embodiment of a data processing system according to the present invention.

FIG. 11 illustrates the configuration of an embodiment of the data processing system according to the present invention. In this embodiment, though not particularly limited, a microcomputer chip and an EEPROM chip may be implemented as a single semiconductor device in a laminate structure. The microcomputer chip and EEPROM chip, integrally encapsulated in the single device, are internally interconnected through bonding wires corresponding to an IIC bus. The microcomputer chip laminated with the EEPROM chip may be connected to a LCD (liquid crystal display) driver which has an LCD driver chip mounted therein as another peripheral device through an IIC bus formed on a board. Though not particularly limited, the LCD driver may be implemented by CMOS devices.

When there are a plurality of peripheral devices which constitute the data processing system such as the EEPROM and LCD driver, a different device address must be assigned to each of the devices. In this embodiment, each of the EEPROM chip and LCD driver can be assigned a unique device address adapted to the system by storing the device address in its device address memory implemented by a built-in non-volatile memory as mentioned above. When the device address is stored in the built-in non-volatile memory as described above, the semiconductor device does not require address terminals for setting the device address, while the board does not need either wires for communicating high level/low levels for the device address to the address terminals.

Figure 12:
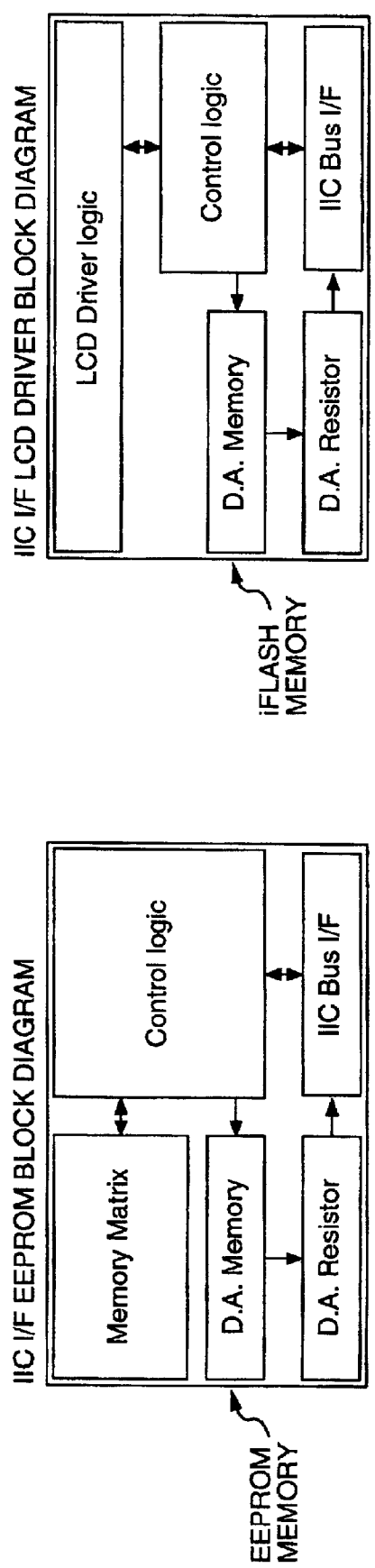
FIG. 12 is a block diagram illustrating an embodiment of each of semiconductor chips which corresponds to a peripheral circuit that forms part of the data processing system of FIG. 11.

FIG. 12 illustrates block diagrams of respective semiconductor chips corresponding to the peripheral circuits which constitute the data processing system of FIG. 11. The EEPROM memory comprises an IIC bus interface circuit (IIC Bus I/F); a logic control circuit (Control logic) as mentioned above; a device address memory (D.A. Memory); a device address register (D.A. Register); and a memory matrix which organizes a memory area. The device address memory (D.A. Memory) is comprised of memory cells identical to those which constitute the memory matrix.

The LCD driver comprises an IIC bus interface circuit (IIC Bus I/F); a logic control circuit (Control logic); a device address memory (D.A. Memory); a device address register (D.A. Register); and an LCD driver circuit (LCD Driver logic). Since the LCD driver is comprised of a CMOS circuit, an iFlash memory may be utilized therefor. This is a non-volatile memory comprised of a single-layer gate structure that can be manufactured by the CMOS process, as later described.

FIG. 13 is a cross-sectional view generally illustrating an embodiment of a non-volatile memory device used in the present invention. A MONOS memory cell and a FLOTOX memory cell each have a floating gate for accumulating a data charge, and a control gate in a stacked configuration. For the EEPROM which organizes a memory area using memory cells in a two-layered gate structure, the device address memory can be formed using the process for manufacturing the memory cells as it is. However, for a semiconductor device formed by the CMOS process as is the case with the LCD driver, the process for the two-layered gate structure must be added only for the device address memory because the gate electrode is formed in a single layer.

On the other hand, the iFlash memory cell is configured by using a gate formed simultaneously with a gate of an N-channel MOSFET as a floating gate, and forming a control gate capacitively coupled with the floating gate of an n-type diffusion layer formed within a semiconductor region. The n-type diffusion layer is formed simultaneously with a source and a drain diffusion layer of the MOSFET. The floating gate, extending horizontally, is formed integrally with a floating gate shown on the right-hand side of FIG. 13, and the floating gate is formed as straddling over the source and drain diffusion layers. In other words, the cross-section of the iFlash memory cell viewed from the left is two-dimensionally formed in a direction shifted by 90° from the cross-section of the same viewed from the right. Thus, the iFlash memory is also called a "non-volatile memory in single-layered gate structure" because of its single-layered gate structure. The iFlash memory cell is described in detail in Japanese Patent Applications Nos. 11-23631, 12-38167, 12-71079, and the like.

By controlling the EEPROM such that a writing or an erasing operation therefor does not result in a depletion mode, a MOSFET for address selection, i.e., a MOSFET having a select gate in FIG. 13 may be omitted from the EEPROM. Thus, other than the MONOS and FLOTOX type ones, non-volatile memory cells constituting the EEPROM may take a variety of implementations.

Figure 14:
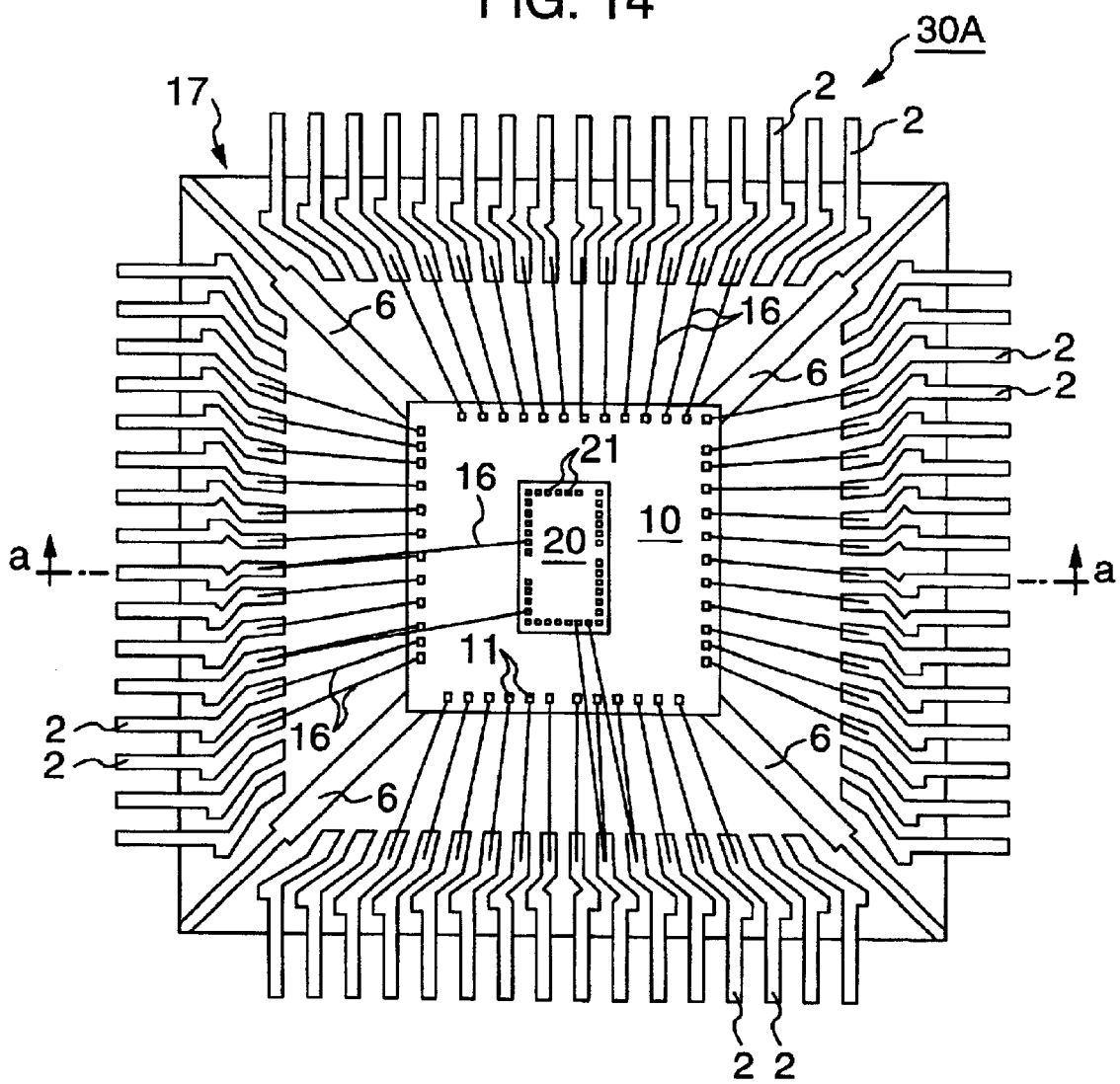
FIG. 14 is a diagrammatic plan view illustrating an embodiment of a semiconductor device according to the present invention.
Figure 15:
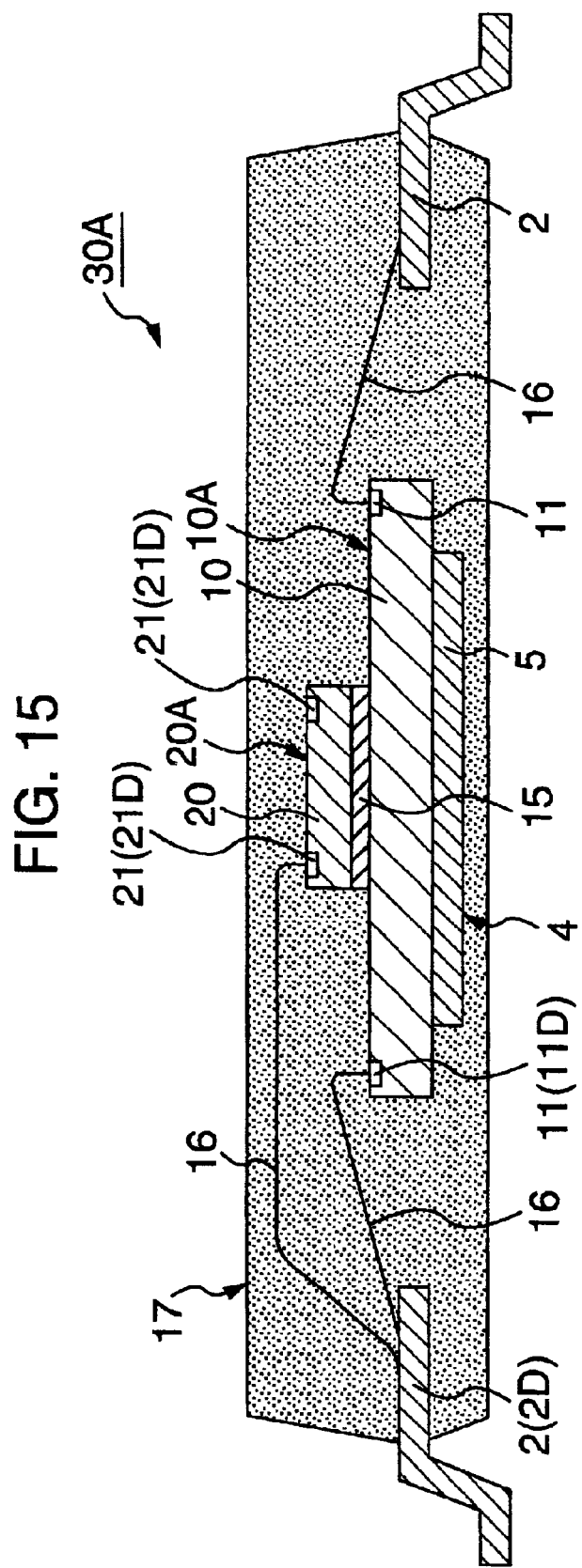
FIG. 15 is a diagrammatic cross-sectional view taken substantially along an a—a section line in FIG. 14.

FIG. 14 illustrates a diagrammatic plan view of an embodiment of a semiconductor device according to the present invention. This embodiment is intended for a QFP (Quad Flatpack Package) semiconductor device. FIG. 14 diagrammatically illustrates the semiconductor device when an upper portion of a resin encapsulant for the semiconductor device is removed. FIG. 15 illustrates a diagrammatic cross-sectional view substantially taken along a section line a—a in FIG. 14. As can be seen in FIG. 15, each section line is partially bend such that bonding wires and two semiconductor chips appear in the figure.

A QFP semiconductor device 30A in this embodiment comprises two semiconductor chips (a microcomputer chip 10 and an EEPROM chip 20) laminated one above the other, which are encapsulated by a single resin encapsulant 17.

The microcomputer chip 10 and EEPROM chip 20 are formed in different plane sizes (outer dimensions), and are both two-dimensionally formed in the shape of rectangle. In this embodiment, the microcomputer chip 10 is two-dimensionally formed, for example, in a rectangle of 4.05 [mm]×4.15 [mm], while the EEPROM chip 20 is two-dimensionally formed, for example, in a rectangle of 1.99 [mm]×1.23 [mm]. In other words, the EEPROM chip 20 is smaller than the microcomputer chip 10 in plane size. Here, the plane size refers to the size of a surface on which an associated circuit is formed, so that the EEPROM chip 20 is smaller than the microcomputer chip 10 in the area in which the associated circuit is formed.

The microcomputer chip 10 and EEPROM chip 20 comprise, for example, a semiconductor substrate made of single-crystal silicon; a multi-layered wiring layer comprised of a plurality of layers such as an insulating layer and a wiring layer laminated on a circuit forming surface of the semiconductor circuit; and a surface protection film (final protection film) formed to cover the multi-layered wiring layer.

Out of a circuit forming surface (one main surface) 10A and a back surface (the other main surface) of the microcomputer chip 10 opposite to each other, the circuit forming surface 10A is formed with a plurality of bonding pads 11. The plurality of bonding pads 11 are formed on the topmost wiring layer of the multi-layered wiring layer of the microcomputer chip 10. The topmost wiring layer of the multi-layered wiring layer is covered with the surface protection film formed thereon. The surface protection film is formed with bonding openings for exposing the surfaces of the bonding pads 11.

Out of a circuit forming surface (one main surface) 20A and a back surface (the other main surface) of the EEPROM chip 20 opposite to each other, the circuit forming surface 20A is formed with a plurality of bonding pads 21. The plurality of bonding pads 21 are formed on the topmost wiring layer of the multi-layered wiring layer of the EEPROM chip 20. The topmost wiring layer of the multi-layered wiring layer is covered with the surface protection film formed thereon. The surface protection layer is formed with bonding openings for exposing the surfaces of the bonding pads 21.

Each of the bonding pads 11 of the microcomputer chip 10 and each of the bonding pads 21 of the EEPROM chip 20 are two-dimensionally formed, for example, in a square of 65 [μm]×65 [μm]. The plurality of bonding pads 11 of the microcomputer chip 10 are arranged along the four sides of the microcomputer chip 10. The plurality of bonding pads 21 of the EEPROM chip 20 are likewise arranged along the four sides of the EEPROM chip 20.

The EEPROM chip 20 is mounted on the circuit forming surface 10A of the microcomputer chip 10 with the back surface or the other main surface of the EEPROM chip 20 facing the circuit forming surface 10A of the microcomputer chip 10, and fixedly adhered to the circuit forming surface 10A of the microcomputer chip 10 with an adhesive layer 15 interposed therebetween. In this embodiment, the adhesive layer 15 may be, for example, a polyimide-based adhesive resin film.

The microcomputer chip 10 is fixedly adhered to a die pad 5 with an adhesive layer interposed therebetween with the back surface thereof facing the die pad 5. The die pad 5 is integrated with four suspending leads 6, such that a supporter 4 is made up of the die pad 5 and four suspending leads 6.

The resin encapsulant 17 is two-dimensionally formed in a rectangular shape. In this embodiment, the resin encapsulant 17 is two-dimensionally formed, for example, in a square of 10 [mm]×10 [mm]. The resin encapsulant 17 is formed of an epoxy-based resin added with a phenol curing agent, silicone rubber, filler and the like for purposes of reducing stress. The resin encapsulant 17 may be formed using a transfer molding method suitable for mass production. The transfer molding method involves using a mold formed with a pot, a runner, an inflow gate, a cavity and the like, and injecting a resin from the pot into the cavity through the runner and inflow gate to form a resin encapsulant.

Around the microcomputer chip 10, a plurality of leads 2 are arranged along the respective sides of the resin encapsulant 17. Each of the plurality of leads 2 is comprised of an inner lead portion and an outer lead portion integrally formed with the inner lead portion. The inner lead portion of each lead 2 is positioned within the resin encapsulant 17, while the outer lead portion is positioned outside the resin encapsulant 17. In other words, the plurality of leads 2 extend inside and outside the resin encapsulant 17. The outer lead portion of each lead 2 is bent, for example, in a gull-wing shape which is one of lead shapes for use in the surface mounting.

Bonding pads of the microcomputer chip 10 and EEPROM chip 20 are connected in common to the leads 2 connected to the IIC buses of the chips 10, 20. Specifically, the leads corresponding to the clock SCL and serial data SDA (represented by the corresponding leads 2 in FIG. 15) of the microcomputer chip 10 and EEPROM chip 20 are connected to associated bonding pads through bonding wires 16, respectively. In other words, the microcomputer chip 10 and EEPROM chip 20 are connected to the IIC bus structure through the two bonding wires 16 within the semiconductor device.

Figure 16:
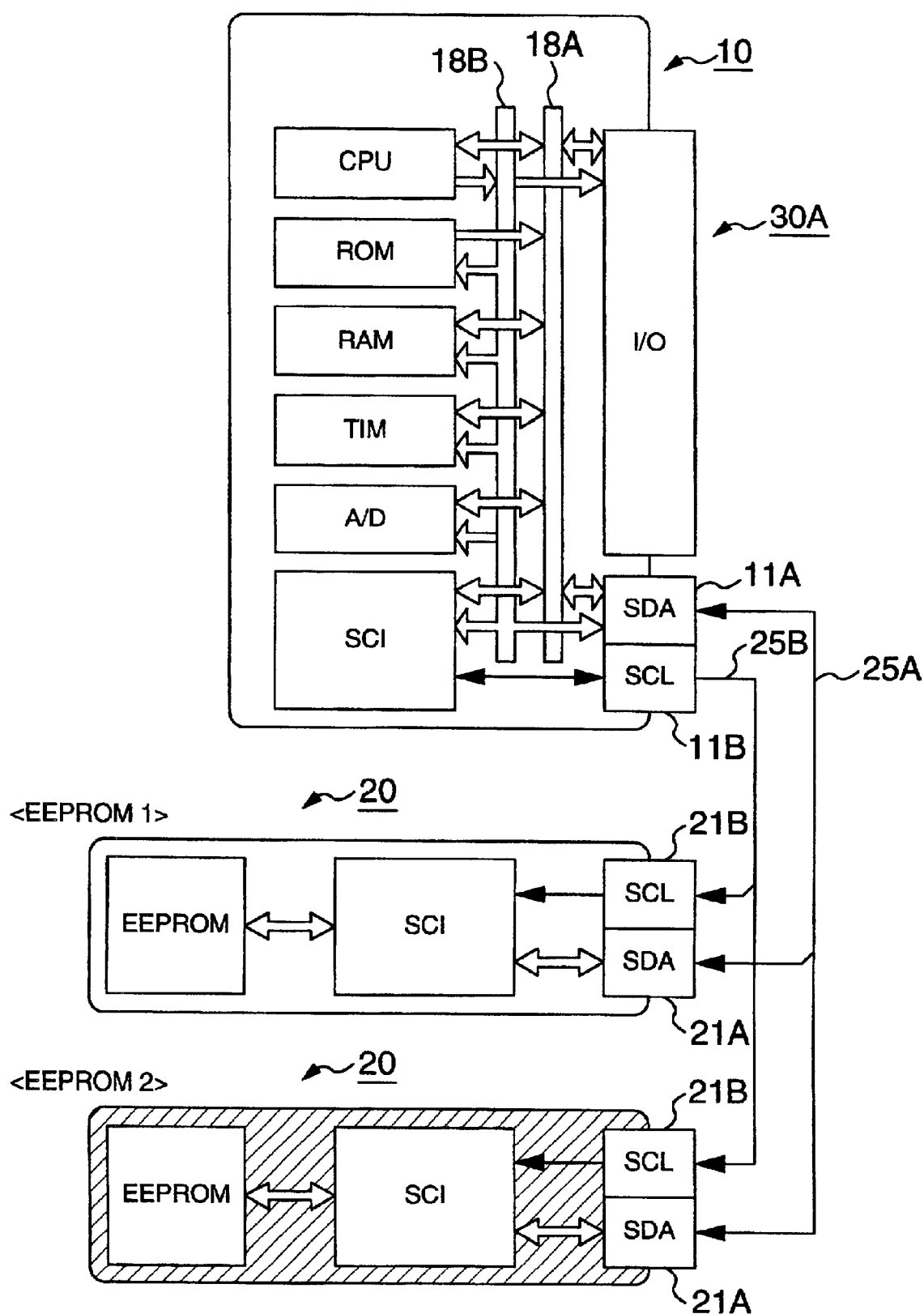
FIG. 16 is a block diagram illustrating an embodiment of a data processing system according to the present invention.

FIG. 16 is a block diagram illustrating an embodiment of a data processing system according to the present invention. A microcomputer chip 10 comprises a processor unit (CPU), a ROM unit (ROM), a RAM unit (RAM), a timer unit (TIM), an A/D converter unit (A/D), a serial communication interface unit (SCI), a data input/output circuit unit (I/O), and the like, all of which are mounted on the same semiconductor substrate. The respective units are interconnected through a data bus 18A and an address bus 18B. The processor unit (CPU) is mainly comprised of a central processing unit, a control circuit, a processing circuit, and the like. The microcomputer chip 10 thus configured is operated, for example, in accordance with a program stored in the ROM unit (ROM).

The EEPROM chip 20 comprises a serial communication interface unit (SCI), a non-volatile storage unit (EEPROM), and the like, all of which are mounted on the same semiconductor substrate. The serial communication interface unit (SCI) includes the aforementioned control logic circuit, device address memory, device address register, and comparator circuit.

The EEPROM chip 20 has a bonding pad 21A for serial data (SDA) and a bonding pad 21B for a serial clock (SCL), which are signal terminals, in a plurality of bonding pads 21. The microcomputer chip 10 has a bonding pad 11A for serial data (SDA) and a bonding pad 11B for a serial clock (SCL), which are signal terminals, in a plurality of bonding pads 11.

The SDA bonding pad 21A of the EEPROM chip 20 is electrically connected to the SDA bonding pad 11A of the microcomputer chip 10 through a signal transmission path 25A, while the SCL bonding pad 21B of the EEPROM chip 20 is electrically connected to the SCL bonding pad 11B of the microcomputer chip 10 through a signal transmission path 25B.

Serial data is written into the non-volatile storage unit (EEPROM) of the EEPROM chip 20 by the operation of the microcomputer chip 10. Specifically, the non-volatile storage unit (EEPROM) of the EEPROM chip 20 is controlled by a control signal from the processor unit (control circuit) of the microcomputer chip 10 for a write operation and a read operation. The signal transmission paths 25A, 25B are each comprised of the inner lead portions and two bonding wires. In other words, the signal transmission paths 25A, 25B are electrically connected to the internal lead portions of the leads 2 respectively through the bonding wires, as illustrated in FIG. 15.

Specifically, the electrical connection of the microcomputer chip 10 to the EEPROM chip 20 is made within the resin encapsulant 17 through the inner lead portions of the lead 2 and the two bonding wires 16. With such a structure, a lead frame developed as suitable for the microcomputer chip 10 can be used, as it is, for any type of microcomputer chip, thereby eliminating the need for newly developing a lead frame adapted to each type of microcomputer chip 10. It is not either necessary to develop each and every type of microcomputer chip which comprises EEPROM bonding pads for electrical connection with the EEPROM chip 20.

A serial data signal is outputted from the SDA bonding pad 11A of the microcomputer chip 10, and inputted to the SDA bonding pad 21A of the EEPROM chip 20 through the bonding wire 16, lead 2, and bonding wire 16. A serial clock signal is outputted from the SCL bonding pad 11B of the microcomputer chip 10, and inputted to the SCL bonding pad 21B of the EEPROM chip 20 through the bonding wire 16, lead 2, and bonding wire 16.

In this embodiment, the data processing system comprises two EEPROMs, EEPROM1 and EEPROM2. One of the two EEPROMs, EEPROM1 is attached to the microcomputer chip 10 in a laminate structure, and integrally encapsulated, as illustrated in the aforementioned FIG. 14. On the other hand, the EEPROM2, indicated by hatchings, is used as an external expansion memory. The EEPROM 1 and EEPROM 2 are fabricated on the same semiconductor chip, and the EEPROM 1 is integrated with the microcomputer chip 10 in a laminate structure, while the EEPROM2 is used alone as a single semiconductor device. The expanded EEPROM2 is mounted on a circuit board as illustrated in FIG. 11, and connected to the IIC bus.

In this embodiment, since the EEPROM1 and EEPROM2 are mounted in a single data processing system, different device addresses must be set to them, respectively. For setting different device addresses, the device address memory may be re-written as described above, such that the preliminary device address "000" is left unchanged in one EEPROM, while a different device address such as "101" is substituted for the preliminary device address in the other EEPROM.

Figure 17:
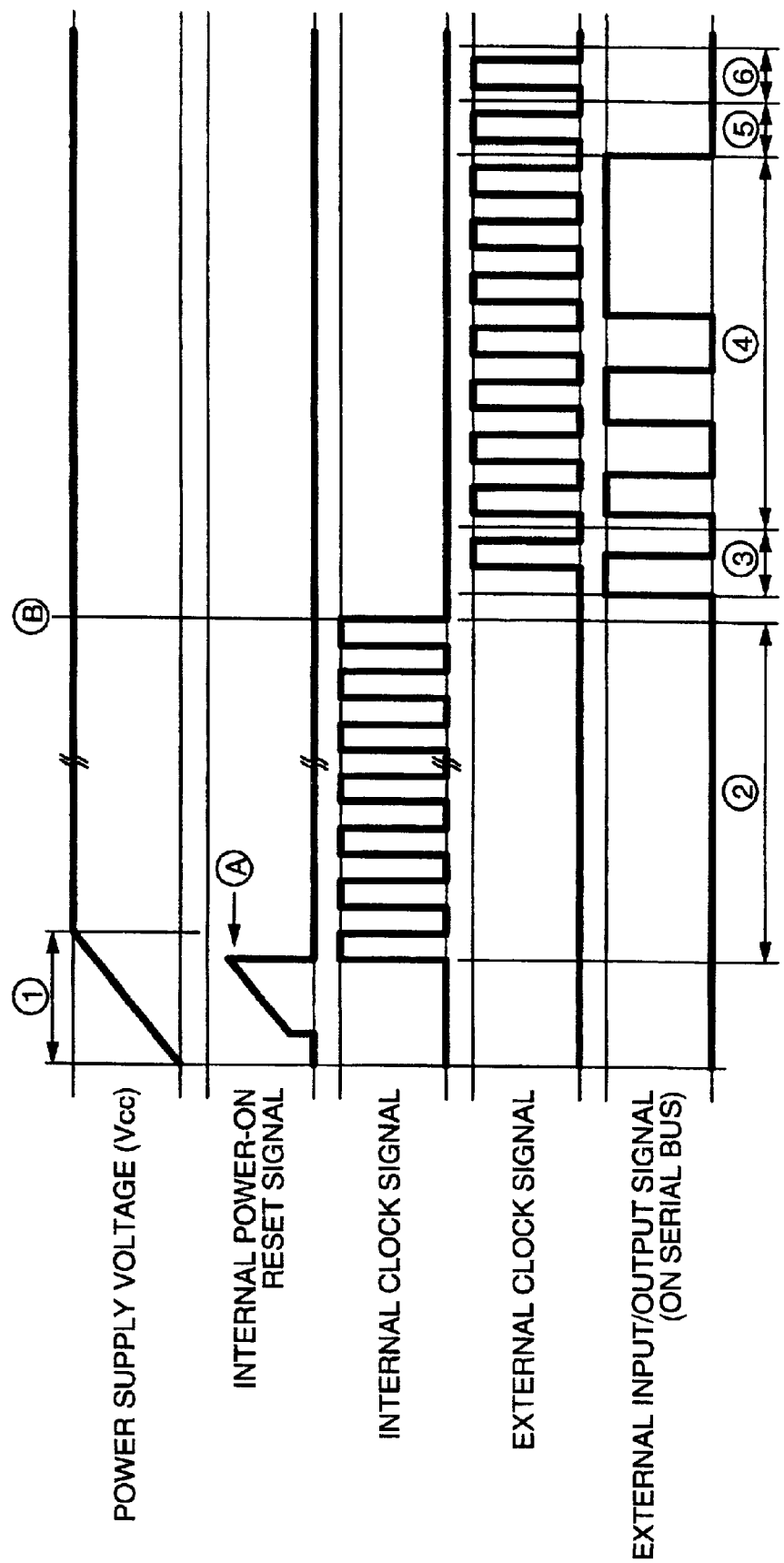
FIG. 17 is a timing diagram for explaining an exemplary operation of a serial EEPROM according to the present invention.

FIG. 17 shows a timing diagram for explaining an exemplary operation of the serial EEPROM according to the present invention. This timing diagram corresponds to the embodiment illustrated in FIG. 9. As previously described, the control logic circuit b. receives the power-on reset signal k. formed by the power-on reset circuit a., selects the device address memory c. in response to a clock signal internal to the device (EEPROM), reads the device address stored therein, and stores the read device address in the device address register d.

In FIG. 17, a period 1 is required for the power supply voltage Vcc to rise to a stead-state voltage, and a timing A indicates a load operation start point, i.e., a power-on reset release point. When a predetermined voltage of the power supply voltage Vcc before it rises to the steady-state voltage, i.e., a power supply fluctuation allowable value is Vcc±10% at timing A, the control logic circuit a. detects that the power supply voltage Vcc has reached a predetermined voltage equal to or lower than its minimum voltage, resets the reset signal previously generated corresponding to the rising edge of the power supply voltage Vcc to generate the power-on reset signal.

Upon receipt of the falling power-on reset signal (the reset is released), the control logic circuit b. selects the device address memory c. in response to the internal clock signal to read the device address stored therein, which is held in the device address register d. This operation of the control logic circuit b. is performed in a period 2 which is called a "load operation period." A timing B indicates a load operation complete timing, from which a device available period begins.

For example, if an external input/output signal (SDA) is changed from high level to low level in a period 3 with the external clock signal (SCL) on the IIC bus remaining at high level, a start condition input (Start) is set. Subsequently, a device address input period 4 is set for inputting an 8-bit device address word in response to the external clock signal. Specifically, a 4-bit device code and a 3-bit device address are inputted, followed by a period 5 in which the eighth write/read mode bit is set (the device addresses are compared within the serial EEPROM). Then, in a period 6 at the ninth bit, the EEPROM sends the ACK signal set at "0," and within the EEPROM, the device address comparator circuit e. outputs the result of comparison between the inputted and stored device addresses.

When the power-on reset circuit a. is used as in the foregoing embodiment, a voltage having a certain margin is used in consideration of fluctuations in the power supply voltage Vcc for generating the power-on reset signal. For this reason, when the operating voltage of the EEPROM is reduced, the power supply voltage Vcc is further reduced at the time the power-on reset signal is generated. For example, when the power supply voltage Vcc is at a relatively high voltage, for example, approximately 3.3 V, a power-on reset release voltage may be set at a relatively high voltage such as 2.5–2.6 V.

However, when the power supply voltage Vcc is at a relatively low voltage of approximately 2.0–2.5 V, the power-on reset release voltage will be set at a low voltage such as 1.5–1.8 V. When the reset is released to access the device address memory as described above with such a low voltage, a sufficient voltage is not provided for reading the device address from the device address memory, possibly resulting in a malfunction that the correct device address cannot be read. From the foregoing, it is appreciated that the embodiment illustrated in FIG. 10, which has the start condition detector circuit a. built in the control logic circuit b. and reads the device address using an external clock signal, is advantageous from a viewpoint of the prevention of malfunction for a device which operates at a low voltage (2.0–2.5 V).

Figure 18:
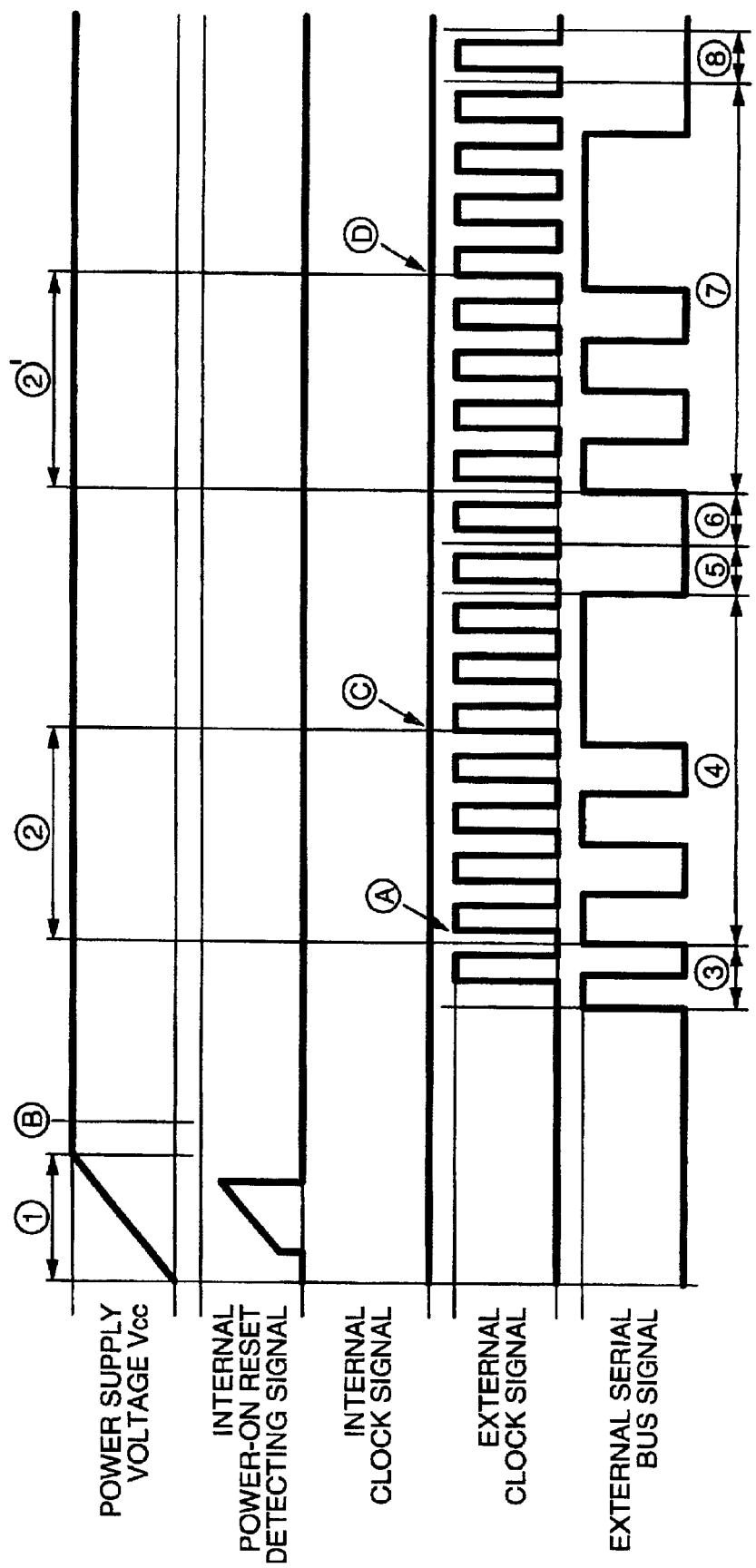
FIG. 18 is a timing diagram for explaining another exemplary operation of a serial EEPROM according to the present invention.

FIG. 18 shows a timing diagram for explaining another exemplary operation of the serial EEPROM according to the present invention. This timing diagram corresponds to the embodiment illustrated in FIG. 10. As previously descried, the start condition detector circuit a. is built in the control logic circuit b. such that the device address is read using an external clock signal.

In FIG. 18, a period 1 is required for the power supply voltage Vcc to rise to a stead-state voltage, similar to FIG. 17. A timing b indicates a device available point at which the power supply voltage Vcc reaches the steady-state voltage. In this embodiment, the device is made available without an effective device address held in the device address register. Therefore, in a period 3, a start condition input (Start) is set by changing the external input/output signal (SDA) from high level to low level when the external clock signal (SCL) on the IIC bus is at high level.

Subsequently, a device address input period 4 is set in response to the external clock signal for inputting an 8-bit device address word. Specifically, a 4-bit device code and a 3-bit device address are inputted, followed by a period 5 in which the eighth write/read mode bit is set (the device addresses are compared within the serial EEPROM). Then, in a period 6 at the ninth bit, the EEPROM sends the ACK signal set at "0," and within the EEPROM, the device address comparator circuit e. outputs the result of comparison between the inputted and stored device addresses.

As the start condition detector circuit a. provided in the control logic circuit b. detects a start condition inputted in the period 3, the start condition detector circuit a. selects the device address memory c. in response to a signal internal to the device (EEPROM) using the clock signal in a period 2 which is parallel with a device address input included in the period 4, reads the device address stored therein, and stores the read device address in the device address register d. before the input device address is compared with the stored device address at the eighth bit.

In this embodiment, though not particularly limited, trimming data may be loaded in a period 2' newly provided after the period 6 in which the ACK signal set at "0" is sent. The period 2' is included in a period 7 in which the first address is subsequently inputted. The trimming data, which may be provided for compensating the device for variations introduced within the manufacturing process, is stored in a memory device similar to the device address memory, such that the trimming data is read for compensating associated circuits for variations due to the process.

Though not particularly limited, the EEPROM may contain a power supply circuit which includes a charge pump circuit for forming a high voltage for writing or a high voltage for erasure. Since the writing voltage or erasing voltage is a critical parameter which determines the amount of writing or the amount of erasure of the storage device, the voltage must be highly accurately set. However, since variations in MOSFETs introduced during the manufacturing process thereof make it difficult to set a desired voltage, trimming data for compensating the MOSFETs for the variations should be stored in a nonvolatile memory, such that the trimming data is read, when the EEPROM starts operating, to control the voltage, thereby making it possible to implement stable writing and erasing operations without being affected by the variations in MOSFET devices due to the manufacturing process.

Figure 19:
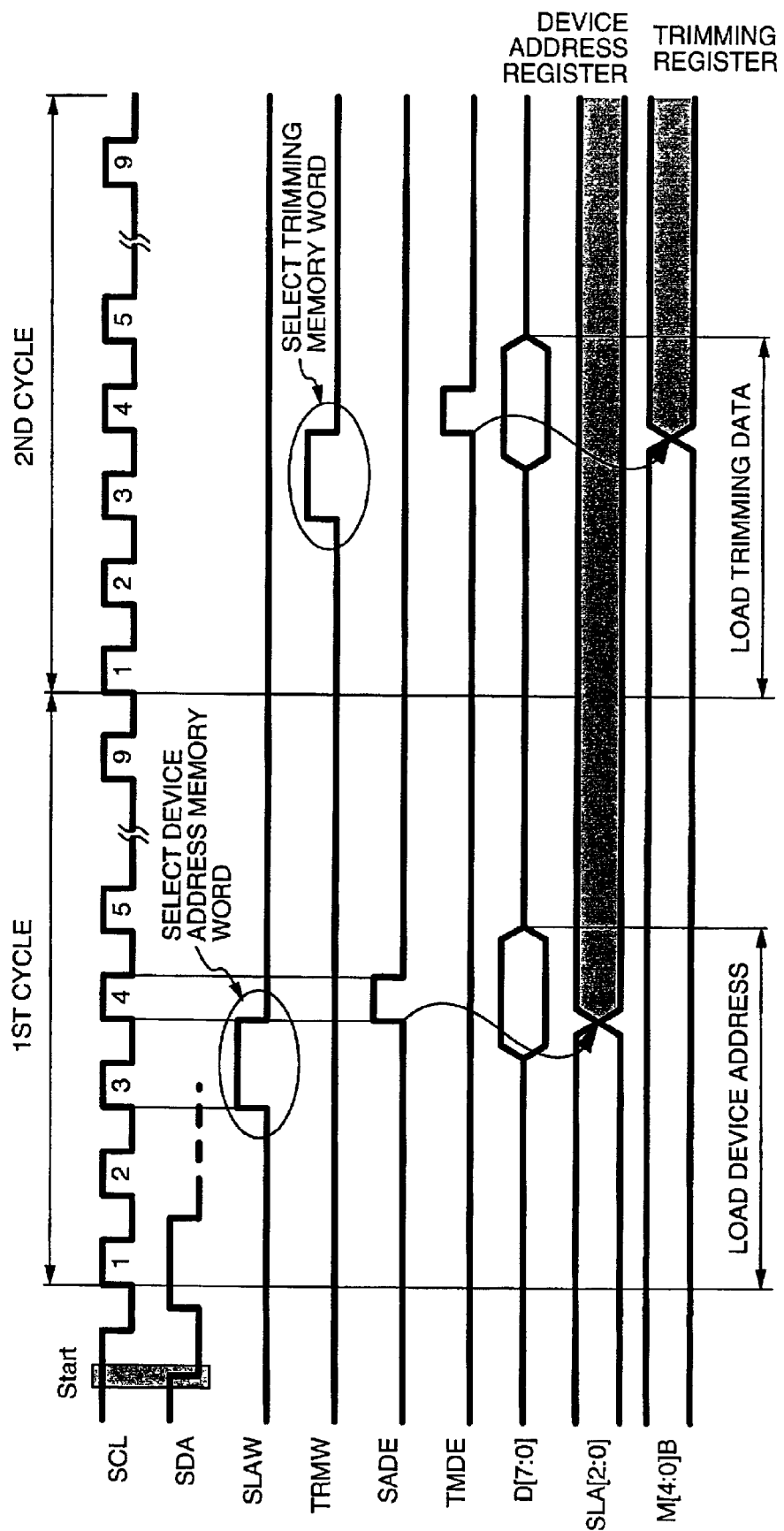
FIG. 19 is a timing diagram for explaining a further exemplary operation of a serial EEPROM according to the present invention.

FIG. 19 shows a timing diagram for explaining a further exemplary operation of the serial EEPROM according to the present invention. This timing diagram shows how the control logic circuit b. loads a device address and trimming data in the period 2 and period 2' in the aforementioned FIG. 18.

As a start condition is set by the clock signal SCL and serial data SDA, the start condition detector circuit a. detects the start condition. In the first cycle (device address input period) from the first to ninth clock signals SCL, a word line is selected for the device address at the third clock, and 8-bit data is outputted to a data bus D[7:0] at the fourth clock. Then, a device address SLA [2:0] comprised of 3-bit data within the 8-bit data is stored in the device address register.

Subsequently, in the second cycle (first memory address input period) from the first to ninth clock signals SCL, a word line is likewise selected for a trimming memory at the third clock, and 8-bit data is outputted to the data bus D[7:0] at the fourth clock. Then, trimming data M[4:0] comprised of 5-bit data within the 8-bit data is stored in a trimming register.

As described above, the following benefits can be provided according to the foregoing embodiments.

(1) A semiconductor device having an internal circuit which performs a circuit operation corresponding to a signal inputted/outputted through an input/output interface circuit adapted to a serial bus is provided with a non-volatile storage circuit for storing identification data. Internal identification data stored in the non-volatile storage circuit is compared with external identification data included in an input signal supplied through the serial bus by a comparator circuit. A control circuit, responsive to a match detecting signal from the comparator circuit, performs a circuit operation corresponding to a subsequently supplied input signal through the serial bus. The control circuit is capable of changing the internal identification data stored in the non-volatile storage circuit so that a device address can be set in the semiconductor device, thereby making the semiconductor device highly usable and flexible.

(2) Under the condition that the identification data stored in the non-volatile storage circuit transitions to a predetermined state, an internal identification signal is read and transferred to a predetermined storage circuit, so that the device address can be consistently and rapidly determined.

(3) The semiconductor device further comprises a power supply voltage detector circuit for receiving a power supply voltage to detect that the power supply voltage reaches a first level to create the predetermined state, so that the device address can be consistently and rapidly determined.

(4) The semiconductor device further comprises a reset signal input terminal, wherein the predetermined state is set when a predetermined signal is inputted to the reset signal input terminal, thereby making it possible to eliminate a tedious operation of once shutting off and again turning on the power supply voltage for loading a re-written device address into the device address register as well as to simplify the circuit configuration because a dedicated supply voltage detector circuit is not required.

(5) The circuit configuration in the semiconductor device can be simplified by setting the predetermined state by a predetermined input signal which is first supplied through the serial bus after the power is turned on.

(6) As assigned circuit operations, the control circuit performs an operation for rewriting identification data in the non-volatile storage circuit in response to the input signal, and an operation directed to the internal circuit in response to the input signal, so that the serial bus standard can be utilized as it is to set a device address.

(7) The semiconductor device further comprises a second input/output interface circuit adapted to the serial bus, and a signal processing circuit provided through the second input/output interface circuit. The second input/output interface circuit and signal processing circuit are mounted in a first semiconductor chip. The first input/output interface circuit, internal circuit, non-volatile storage circuit, comparator circuit, and control circuit are mounted in a second semiconductor chip. On the main surface of the first semiconductor chip, the second semiconductor chip is integrally encapsulated in a laminate structure, so that the semiconductor device is low in cost, small in size and high in performance.

(8) The serial bus is configured to connect the two semiconductor chips through first bonding wires for connecting bonding pads corresponding to the second input/output interface circuit in the first semiconductor chip to associated leads, and second bonding wires for connecting bonding pads corresponding to the first input/output interface circuit in the second semiconductor chip to associated leads. With this serial bus, the two semiconductor chips can be combined in a flexible and simple manner.

(9) The first semiconductor chip includes a processor unit, and a ROM for storing a signal processing procedure performed by the processor unit, while the second semiconductor chip includes a memory circuit which is allocated an address space different from an address space allocated to the non-volatile storage circuit for storing the identification data, thereby providing the small and high performance semiconductor device which can be flexibly adapted to any data processing system.

(10) The memory circuit is comprised of memory cells in the same structure as the non-volatile storage circuit for storing the identification data, thereby making it possible to reasonably manufacture a single semiconductor device having two circuits formed through difference semiconductor processes.

(11) The internal circuit comprises a CMOS circuit, and the non-volatile storage circuit for storing the identification data is comprised of nonvolatile memory cells in a single-layered gate structure formed by a manufacturing process used for manufacturing the CMOS circuit, thereby making it possible to streamline the manufacturing process.

(12) The internal identification data includes first internal identification data and second internal identification data, and the comparator circuit and control circuit compare third external identification data included in a first input signal supplied through the serial bus with the first internal identification data stored in the non-volatile storage circuit, and compare fourth external identification data included in the first input signal with second internal identification data stored in the non-volatile storage circuit when the first internal identification data matches the third external identification data, such that the first internal identification data can be changed by a second input signal supplied subsequently to the first input signal through the serial bus under the condition that the second internal identification data matches the fourth external identification data, thereby making it possible to change the device address with a high reliability.

(13) A semiconductor device having an internal circuit for performing a circuit operation corresponding to a signal inputted or outputted through an input/output interface circuit adapted to a serial bus is provided with a non-volatile storage circuit for storing identification data, wherein the circuit operation performed by the internal circuit includes an operation for changing the identification data by an input signal supplied through the serial bus when an internal state transitions to a first state. Thus, the resulting semiconductor device is highly usable, and flexible in setting a device address.

(14) The internal identification data includes first internal identification data and second internal identification data, and the internal circuit compares third external identification data included in a first input signal supplied through the serial bus with first internal identification data stored in the non-volatile storage circuit, and compares fourth external identification data included in the first input signal with second internal identification data stored in the non-volatile storage circuit when the first internal identification data matches the third external identification data under the condition that the second internal identification data matches the fourth external identification data, and performs an operation for changing the first internal identification data by a second input signal supplied subsequent to the first input signal through the serial bus, thereby making it possible to change the device address with a high reliability.

(15) When the serial bus is implemented by an IIC bus, signals can be communicated through two signal lines, and the system design is facilitated.

(16) A data processing system is configured by a plurality of semiconductor devices, each of which comprises an internal circuit for performing a circuit operation corresponding to a signal inputted or outputted through an input/output circuit adapted to a serial bus, and a non-volatile memory for storing identification data. In each of the semiconductor devices, when the internal state of the internal circuit transitions to a first state, the identification data can be changed by an input signal supplied through the serial bus to set a device address. Consequently, the data processing system provides effective utilization of a mounting space on a board which underlies the system, or a reduction in size of the board, as well as flexible adaptability in modification, expansion and the like of the system.

(17) The identification data of each semiconductor device includes first identification data and second identification data, and the internal circuit of each semiconductor device compares third identification data included in a first input signal supplied through the serial bus with first identification data stored in the non-volatile storage circuit, and compares fourth identification data included in the first input signal with second identification data stored in the non-volatile storage circuit when the first identification data matches the third identification data, such that under the condition that the second identification data matches the fourth identification data, the internal circuit in each semiconductor device sets different identification data in the associated semiconductor device by a second input signal supplied subsequent to the first input signal through the serial bus, thereby making it possible to set the device address with a high reliability.

(18) When the serial bus is implemented by an IIC bus, signals can be communicated through two signal lines, and the system design is facilitated.

While the invention made by the present inventors has been described in a specific manner with reference to the foregoing embodiments, the present invention is not limited to those embodiments but may be changed in various ways without departing from the spirit and scope of the invention. For example, for the serial bus, other buses such as the CAN bus standard mainly utilized for cars, serial ATA, USB or IEEE1394 for personal computers, and the like may be utilized as well other than the IIC bus.

The device address memory may employ a fuse or the like which is electrically cut off, other than the non-volatile memory as described above. However, since the fuse-based device address memory allows the writing only once, the re-writable non-volatile memory is better in usability. The present invention can be widely utilized in a variety of semiconductor devices which require device addresses, and serial bus-based data processing systems which use a device address to access a peripheral device. For example, an exemplary system having a plurality of devices interconnected through such a serial bus may be a notebook type personal computer in which a plurality of battery units can be connected, wherein the respective battery units are connected to a serial bus such that each of the batteries can be monitored for the power consumption. Another exemplary system may be a car-equipped audio system which allows a driver to make identification between subsequently added devices and previously mounted devices.

What is claimed is:

1. A semiconductor device comprising:

a first input/output interface circuit adapted to a serial bus;

an internal circuit for performing a circuit operation corresponding to a signal which is inputted or outputted through said first input/output interface circuit between said internal circuit and said serial bus;

a non-volatile storage circuit for storing identification data;

a comparator circuit for comparing internal identification data stored in said non-volatile storage circuit with external identification data included in an input signal supplied through said serial bus; and a control circuit responsive to an input signal subsequently supplied through said serial bus when said comparator circuit generates a match detecting signal for performing a circuit operation corresponding to said input signal, wherein:

said internal identification data is read from said non-volatile storage circuit and transferred to a predetermined storage circuit under the condition that identification data stored in said non-volatile storage circuit transitions to a predetermined state.

2. A semiconductor device according to claim 1, further comprising:

a supply voltage detector circuit for receiving a power supply voltage, wherein:

said predetermined state is set when said supply voltage detector circuit detects that said power supply voltage rises to a first level.

3. A semiconductor device according to claim 1, wherein:

said predetermined state is set by a predetermined input signal which is first supplied through said serial bus after said semiconductor device is powered on.

4. A semiconductor device according to claim 1, further comprising a reset signal input terminal, wherein:

said predetermined state is set when a predetermined signal is inputted to said reset signal input terminal.

5. A semiconductor device comprising:

a first input/output interface circuit adapted to a serial bus;

an internal circuit for performing a circuit operation corresponding to a signal which is inputted or outputted through said first input/output interface circuit between said internal circuit and said serial bus;

a non-volatile storage circuit for storing identification data;

a comparator circuit for comparing internal identification data stored in said non-volatile storage circuit with external identification data included in an input signal supplied through said serial bus;

a control circuit responsive to an input signal subsequently supplied through said serial bus when said comparator circuit generates a match detecting signal for performing a circuit operation corresponding to said input signal;

wiring means adapted to said serial bus, said wiring means having one end connected to said first interface circuit;

a second input/output interface circuit connected to the other end of said wiring means; and a signal processing circuit provided through said second input/output interface circuit, wherein:

said circuit operation performed by said control circuit includes: an operation for re-writing identification data into said non-volatile storage circuit in response to said input signal, and an operation directed to said internal circuit in response to said input signal, said second input/output interface circuit and said signal processing circuit are mounted in a first semiconductor chip, and said first input/output interface circuit, said internal circuit, said non-volatile storage circuit, said comparator circuit and said control circuit are mounted in a second semiconductor chip, and said first semiconductor chip and said second semiconductor chip are integrally encapsulated into said semiconductor device.

6. A semiconductor device according to claim 5, wherein:

said wiring means comprises:

first bonding wires for connecting bonding pads corresponding to said second input/output interface circuit in said first semiconductor chip to associated leads; and second bonding wires for connecting bonding pads corresponding to said first input/output interface circuit in said second semiconductor chip to associated leads.

7. A semiconductor device according to claim 6, wherein:

said signal processing circuit in said first semiconductor chip includes a processor unit, and a ROM for storing a signal processing procedure performed by said processor unit, and said internal circuit in said second semiconductor chip includes a memory circuit which is allocated an address space difference from an address space allocated to said non-volatile storage circuit for storing said identification data.

8. A semiconductor device according to claim 7, wherein:

said memory circuit is comprised of memory cells each having the same structure as said non-volatile storage circuit for storing said identification data.

9. A semiconductor device according to claim 7, wherein:

said internal circuit comprises a CMOS circuit, and said non-volatile storage circuit for storing said identification data is comprised of non-volatile memory cells in a single-layered gate structure formed by a manufacturing process used for manufacturing said CMOS circuit.

10. A semiconductor device, comprising:

a first input/output interface circuit adapted to a serial bus;

an internal circuit for performing a circuit operation corresponding to a signal which is inputted or outputted through said first input/output interface circuit between said internal circuit and said serial bus;

a non-volatile storage circuit for storing identification data;

a comparator circuit for comparing internal identification data stored in said non-volatile storage circuit with external identification data included in an input signal supplied through said serial bus;

a control circuit responsive to an input signal subsequently supplied through said serial bus when said comparator circuit generates a match detecting signal for performing a circuit operation corresponding to said input signal;

said circuit operation performed by said control circuit including:

an operation for re-writing identification data into said non-volatile storage circuit in response to said input signal; and an operation directed to said internal circuit in response to said input signal;

wiring means adapted to said serial bus, said wiring means having one end connected to said first interface circuit;

a second input/output interface circuit connected to the other end of said wiring means; and a signal processing circuit provided through said second input/output interface circuit, wherein:

said second input/output interface circuit and said signal processing circuit are mounted in a first semiconductor chip, and said first input/output interface circuit, said internal circuit, said non-volatile storage circuit, said comparator circuit and said control circuit are mounted in a second semiconductor chip;

said first semiconductor chip and said second semiconductor chip are integrally encapsulated into said semiconductor device;

said signal processing circuit in said first semiconductor chip includes a processor unit, and a ROM for storing a signal processing procedure performed by said processor unit;

said internal circuit in said second semiconductor chip includes a memory circuit which is allocated an address space difference from an address space allocated to said non-volatile storage circuit for storing said identification data;

said internal circuit comprises a CMOS circuit, said non-volatile storage circuit for storing said identification data is comprised of non-volatile memory cells in a single-layered gate structure formed by a manufacturing process used for manufacturing said CMOS circuit;

said internal identification data includes first internal identification data and second internal identification data, wherein said comparator circuit and said control circuit compare third external identification data included in a first input signal supplied through said serial bus with said first internal identification data stored in said non-volatile storage circuit, and compare fourth external identification data included in said first input signal with second internal identification data stored in said non-volatile storage circuit when said first internal identification data matches said third external identification data, such that said control circuit enables an operation for changing said first internal identification data by a second input signal supplied subsequently to said first input signal through said serial bus under the condition that said second internal identification data matches said fourth external identification data.

11. A semiconductor device comprising:

an input/output interface circuit adapted to a serial bus;

an internal circuit for performing a circuit operation corresponding to a signal inputted or outputted through said input/output interface circuit between said internal circuit and said serial bus; and a non-volatile storage circuit for storing identification data, wherein the circuit operation performed by said internal circuit includes an operation for changing said identification data by an input signal supplied through said serial bus when an internal state transitions to a first state, wherein said identification data includes first identification data and second identification data, wherein said internal circuit compares third identification data included in a first input signal supplied through said serial bus with the first identification data stored in said non-volatile storage circuit, and compares fourth identification data included in said first input signal with the second identification data stored in said non-volatile storage circuit when said first identification data matches said third identification data, such that said internal circuit transitions to said first state under the condition that said second identification data matches said fourth identification data, and is permitted to perform an operation for changing said first identification data by a second input signal supplied subsequent to said first input signal through said serial bus.

12. A semiconductor device according to claim 11, wherein said serial bus comprises an IIC bus.

13. A data processing system comprising:

a plurality of semiconductor devices, each said semiconductor device including:

an input/output interface circuit adapted to a serial bus;

an internal circuit for performing a circuit operation corresponding to a signal inputted or outputted through said first input/output interface circuit between said internal circuit and said serial bus; and a non-volatile storage circuit for storing identification data;

wherein said internal circuit of each said semiconductor circuit performs an operation for changing said identification data by an input signal supplied through said serial bus when an internal state of said internal circuit transitions to a first state;

wherein said identification data of said each semiconductor device includes first identification data and second identification data, wherein said internal circuit of each said semiconductor device compares third identification data included in a first input signal supplied through said serial bus with the first identification data stored in said non-volatile storage circuit, and compares fourth identification data included in said first input signal with the second identification data stored in said non-volatile storage circuit when said first identification data matches said third identification data, such that said internal circuit transitions to said first state under the condition that said second identification data matches said fourth identification data, and is permitted to perform an operation for changing said first identification data by a second input signal supplied subsequent to said first input signal through said serial bus, so that different identification data are set in said respective semiconductor devices from one another.

14. A data processing system according to claim 13, wherein: said serial bus comprises an TIC bus.

* * * * *